US 8,895,946 B2

(12) United States Patent
Ceglio et al.

(10) Patent No.: US 8,895,946 B2
(45) Date of Patent: Nov. 25, 2014

(54) SOURCE-COLLECTOR MODULES FOR EUV LITHOGRAPHY EMPLOYING A GIC MIRROR AND A LPP SOURCE

(71) Applicant: Media Lario, S.R.L., Bosisio Parini (IT)

(72) Inventors: Natale M. Ceglio, Pleasanton, CA (US); Daniel Stearns, Los Altos Hills, CA (US); Jacques Kools, Simiane Collongue (FR); Giuseppe Valsecchi, Oggiono (IT); Fabio Zocchi, Samarate (IT); Riccardo Binda, Erba (IT)

(73) Assignee: Media Lario S.R.L., Bosisio Parini (LC) (IT)

( * ) Notice: Subject to any disclaimer, the term of this patent is extended or adjusted under 35 U.S.C. 154(b) by 0 days.

(21) Appl. No.: 13/761,189

(22) Filed: Feb. 7, 2013

(65) Prior Publication Data
US 2013/0207004 A1    Aug. 15, 2013

Related U.S. Application Data

(60) Provisional application No. 61/597,744, filed on Feb. 11, 2012.

(51) Int. Cl.
*H05G 2/00* (2006.01)
*G21K 1/06* (2006.01)
*G02B 5/20* (2006.01)
*G02B 19/00* (2006.01)
*G02B 27/42* (2006.01)

(52) U.S. Cl.
CPC .............. *H05G 2/005* (2013.01); *G21K 1/067* (2013.01); *H05G 2/008* (2013.01); *G02B 5/203* (2013.01); *G02B 19/0095* (2013.01); *G02B 27/425* (2013.01)

USPC ........................................ 250/504 R; 359/350

(58) Field of Classification Search
CPC ....... G21K 1/067; H05G 2/005; H05G 2/008; G02B 27/425
USPC ........................................ 250/504 R; 359/350
See application file for complete search history.

(56) References Cited

U.S. PATENT DOCUMENTS

| 4,945,455 | A  | 7/1990  | Akizuki |
| 5,067,053 | A  | 11/1991 | Akizuki |
| 5,768,339 | A  | 6/1998  | O'Hara |
| 6,278,764 | B1 | 8/2001  | Barbee et al. |
| 6,586,757 | B2 | 7/2003  | Melnychuk et al. |
| 6,633,048 | B2 | 10/2003 | Orsini |
| 7,075,713 | B2 | 7/2006  | Arenberg |
| 7,145,637 | B2 | 12/2006 | Singer |
| 7,164,144 | B2 | 1/2007  | Partlo et al. |
| 7,196,342 | B2 | 3/2007  | Ershov et al. |
| 7,217,940 | B2 | 5/2007  | Partlo et al. |
| 7,322,708 | B2 | 1/2008  | Valenzuela et al. |
| 7,372,049 | B2 | 5/2008  | Klunder et al. |

(Continued)

*Primary Examiner* — Nicole Ippolito
*Assistant Examiner* — Wyatt Stoffa
(74) *Attorney, Agent, or Firm* — Opticus IP Law PLLC

(57) ABSTRACT

Source-collector modules for use with EUV lithography systems are disclosed, wherein the source-collector modules employ a laser-produced plasma EUV radiation source and a grazing-incidence collector. The EUV radiation source is generated by first forming an under-dense plasma, and then irradiating the under-dense plasma with infrared radiation of sufficient intensity to create a final EUV-emitting plasma. The grazing incidence collector can include a grating configured to prevent infrared radiation from reaching the intermediate focus. Use of debris mitigation devices preserves the longevity of operation of the source-collector modules.

19 Claims, 25 Drawing Sheets

(56) References Cited

U.S. PATENT DOCUMENTS

| | | |
|---|---|---|
| 7,399,981 B2 | 7/2008 | Barthod et al. |
| 7,405,804 B2 | 7/2008 | Bakker |
| 7,410,265 B2 | 8/2008 | Antoni et al. |
| 7,460,212 B2 | 12/2008 | Singer et al. |
| 7,592,610 B2 | 9/2009 | Bakker et al. |
| 7,781,750 B2 | 8/2010 | Singer |
| 7,868,304 B2 | 1/2011 | Bakker et al. |
| 7,910,900 B2 | 3/2011 | Dinger et al. |
| 8,067,756 B2 | 11/2011 | Ueno et al. |
| 8,330,131 B2 | 12/2012 | Ceglio et al. |
| 8,390,785 B2 | 3/2013 | Zocchi et al. |
| 8,411,815 B2 | 4/2013 | Wallhead et al. |
| 2002/0141536 A1 | 10/2002 | Richardson |
| 2005/0274912 A1* | 12/2005 | Hergenhan et al. ....... 250/504 R |
| 2006/0131515 A1 | 6/2006 | Partlo et al. |
| 2006/0215712 A1* | 9/2006 | Ziener et al. .................. 372/2 |
| 2007/0084461 A1 | 4/2007 | Box et al. |
| 2007/0114470 A1* | 5/2007 | Bowering ................ 250/504 R |
| 2007/0228303 A1* | 10/2007 | Fujimoto .................... 250/505.1 |
| 2008/0018876 A1 | 1/2008 | Stuezle et al. |
| 2008/0099935 A1 | 5/2008 | Egle et al. |
| 2008/0149862 A1 | 6/2008 | Hansonn et al. |
| 2008/0179548 A1 | 7/2008 | Bykanov et al. |
| 2009/0084992 A1* | 4/2009 | Hosokai et al. ........... 250/504 R |
| 2009/0289205 A1* | 11/2009 | Moriya et al. ........... 250/504 R |
| 2010/0090133 A1* | 4/2010 | Endo et al. ................ 250/504 R |
| 2010/0091941 A1 | 4/2010 | Benedetti et al. |
| 2010/0181503 A1* | 7/2010 | Yanagida et al. ......... 250/504 R |
| 2010/0213395 A1 | 8/2010 | Ueno et al. |
| 2010/0303199 A1* | 12/2010 | Wallhead et al. ............... 378/34 |
| 2011/0043779 A1 | 2/2011 | Benedetti et al. |
| 2011/0101863 A1* | 5/2011 | Komori et al. ........... 315/111.41 |
| 2011/0168925 A1* | 7/2011 | Ceglio et al. ............. 250/504 R |
| 2011/0317256 A1* | 12/2011 | Hou et al. ................ 359/337.21 |
| 2012/0161040 A1* | 6/2012 | Endo et al. ................ 250/504 R |
| 2012/0161631 A1* | 6/2012 | Kuwabara ..................... 315/108 |
| 2012/0248342 A1* | 10/2012 | Moriya et al. ........... 250/504 R |
| 2012/0262688 A1* | 10/2012 | DeVries et al. ................ 355/67 |

\* cited by examiner

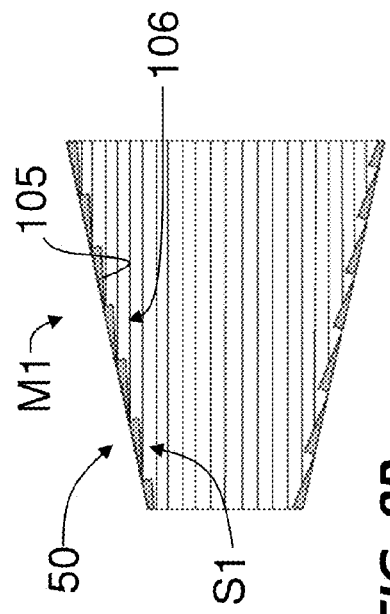
FIG. 8B
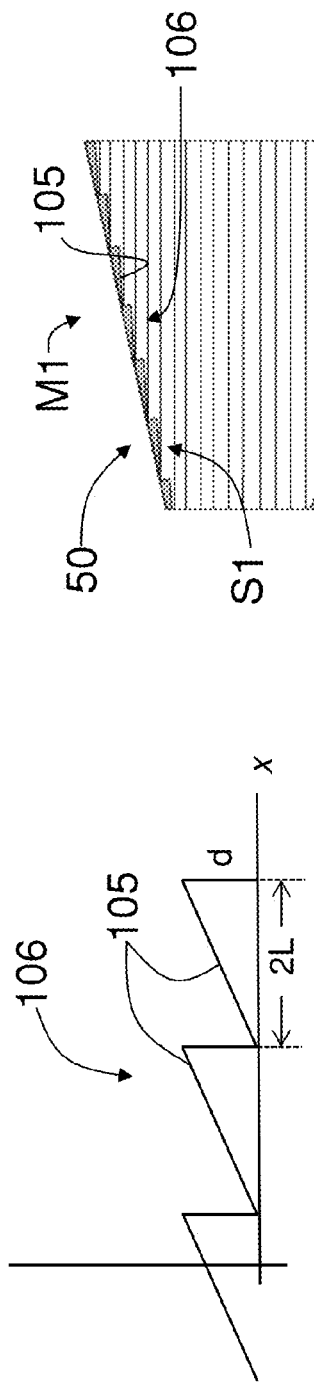
FIG. 8A
FIG. 8C
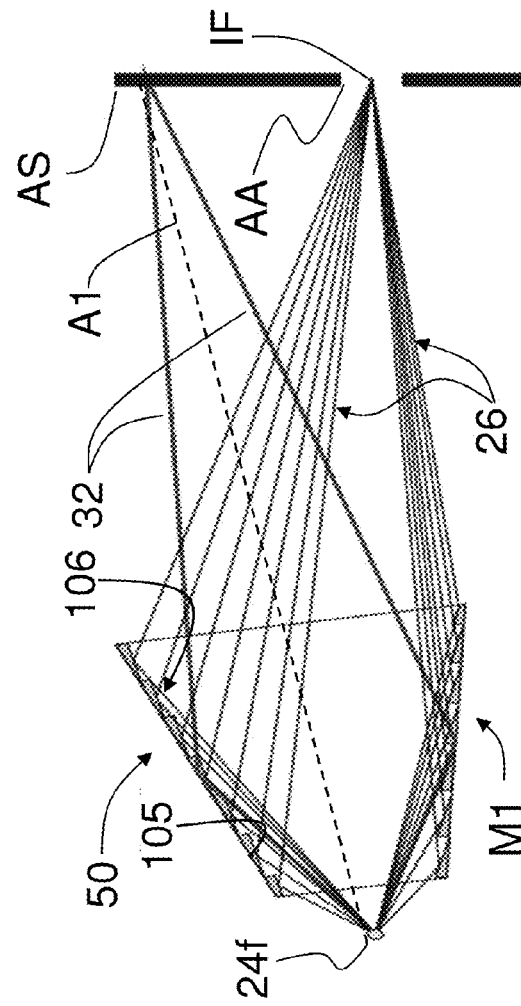
FIG. 8D
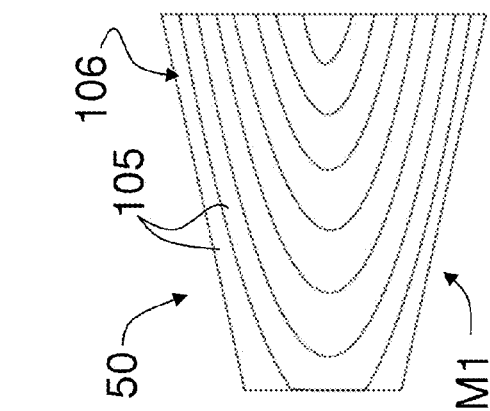

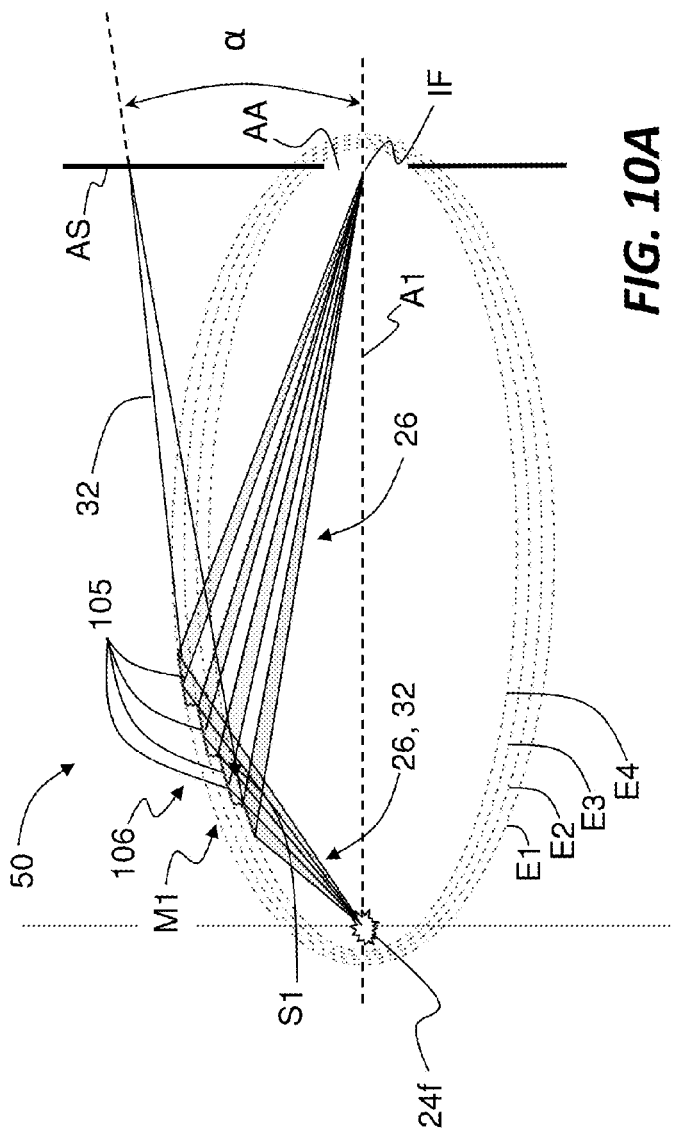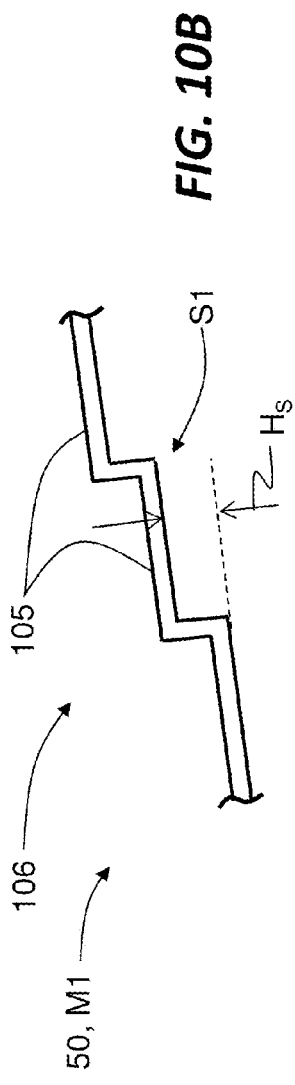

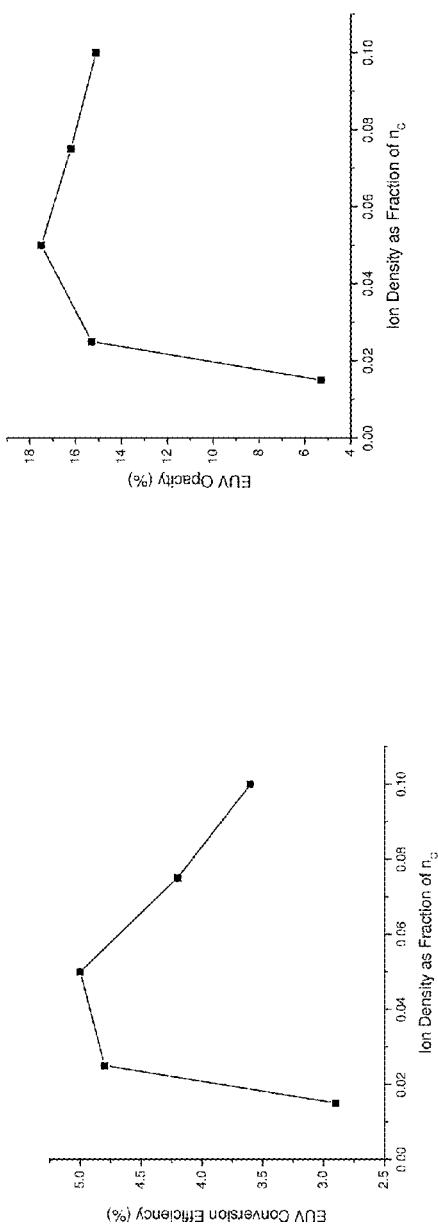
FIG. 11A
FIG. 11B
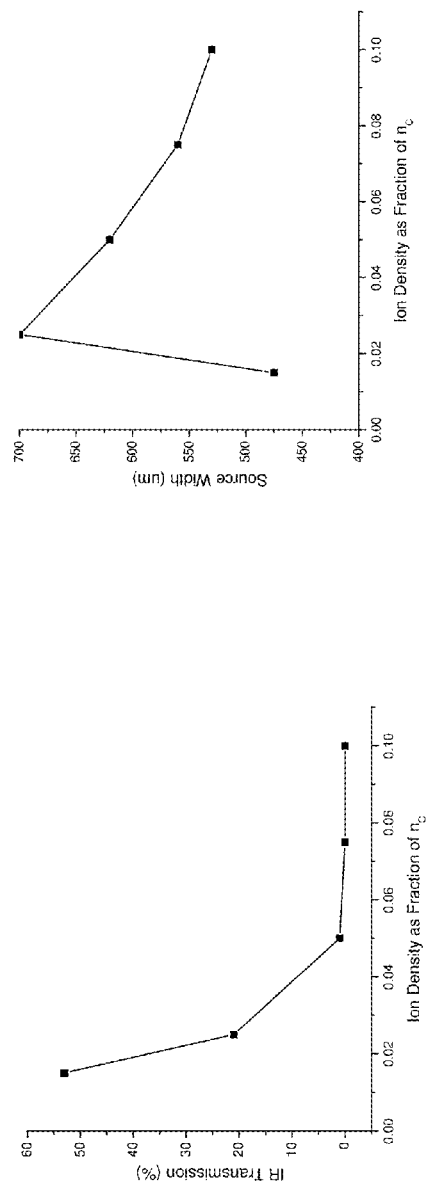
FIG. 11C
FIG. 11D

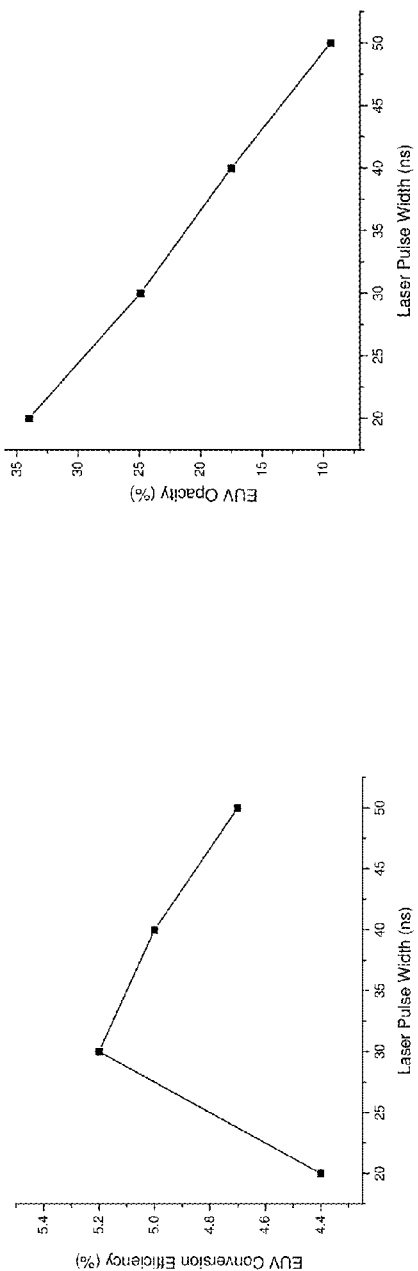
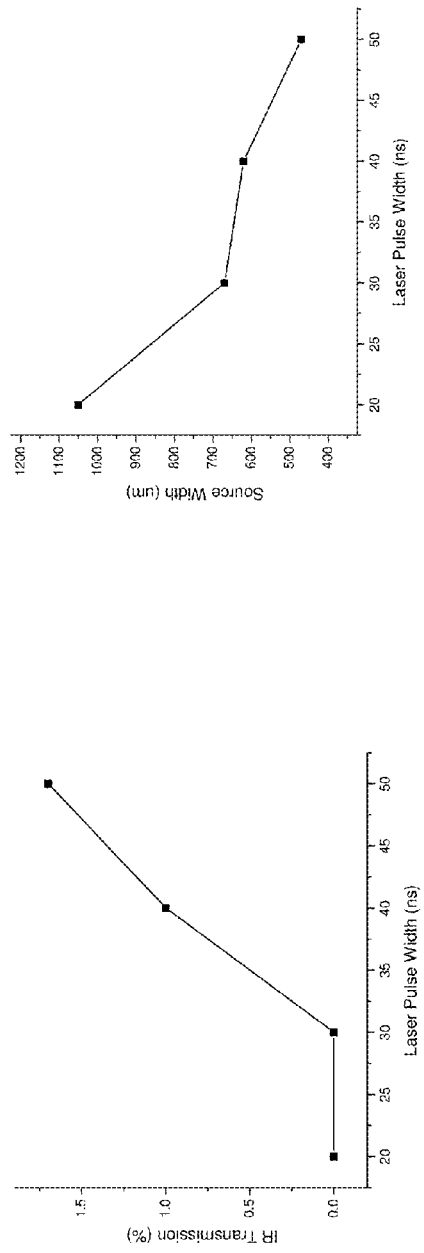
FIG. 13A
FIG. 13B
FIG. 13C
FIG. 13D

SOURCE-COLLECTOR MODULES FOR EUV LITHOGRAPHY EMPLOYING A GIC MIRROR AND A LPP SOURCE

CLAIM OF PRIORITY

This application claims the benefit of priority under 35 U.S.C. §119(e) of U.S. Provisional Application Ser. No. 61/597,744, filed on Feb. 11, 2012, which is incorporated by reference herein.

FIELD

The disclosure relates to extreme ultraviolet (EUV) lithography and in particular to source-collector modules for use with EUV lithography systems, wherein the source-collector modules employ a laser-produced plasma EUV radiation source and a grazing-incidence collector mirror.

BACKGROUND ART

Extreme ultraviolet lithography (EUVL) involves using EUV radiation (typically 13.5 nm+/−2%) generated by an EUV radiation source to irradiate a reflective patterned mask to transfer the pattern onto a photoresist layer supported by a silicon wafer. The use of the small wavelengths associated with EUV radiation allows for the minimum feature size of the imaged pattern to also be small, i.e., as small as 15 nm and below.

There has been a significant effort to create a source collector module (SoCoMo) based on a laser-produced plasma (LPP) with a multilayer coated collector (MCC), which reflects 13.5-nm light at nearly normal incidence angles and so is sometimes called a normal-incident collector (NIC) mirror. The LPP-MCC SoCoMo has proven to be a highly problematic source-collector solution on the path to developing a commercially viable extreme ultraviolet (EUV) lithography system (tool), which is required to deliver high power (i.e., hundreds of watts of EUV radiation at 13.5 nm+/−2%) to an intermediate focus (IF).

The conventional LPP-MCC approach to creating an EUVL SoCoMo suffers from multiple problems: First, there is the vulnerability of the MCC. The LPP plasma environment can severely limit the lifetime and reliability of the MCC. Second, the power delivered from the LPP source to the IF aperture is inadequate. Third, the laser infrared (IR) radiation reflected from the LPP source can be collected by the MCC and delivered to the IF aperture, causing severe problems to downstream optics and lithography components.

To date, the LPP-MCC SoCoMo has proven unreliable because of the vulnerability of the MCC to the high-power EUV source environment. In particular, the multilayer coatings have proven problematic because they quickly degrade because of mixing of the multilayer coating caused by fast ions from the LPP source, and because their performance is also adversely affected by the deposition of tin (Sn) from tin vapor from the LPP source. A very thin Sn layer on the MCC (e.g., 5 nm thick) can drastically reduce the MCC's performance, and such a thin Sn layer can form in less than 1 minute during system operation.

In this regard, attempts to increase the LPP source power increases the risk to the MCC. In addition to the vulnerability of the MCC, another problem of the LPP-driven EUV source is the production of significant amounts of reflected laser light, which can be collected and directed to the intermediate focus, causing problems at the illuminator, the reticle and the wafer. In this regard, attempts to increase the LPP source power also increase the production of reflected IR and associated problems.

These problems have led to an LPP operational situation in which protecting the MCC has become the highest priority. As a result, it has become highly problematic to optimize the LPP-MCC SoCoMo to achieve the required high-power performance and reduce the collection of reflected laser light under commercially viable operating conditions for EUV lithography.

It would be advantageous to eliminate the vulnerability of the MCC as a design constraint in the SoCoMo and thereby increase reliability and allow for the optimization of the LPP source (including reduced collection of reflected laser light) for the high-throughput operation needed for a commercially viable EUV lithography system.

SUMMARY

The present disclosure relates to EUV lithography systems that utilize an EUV light source and a collector optical system to collect the EUV light (radiation) and direct it through an aperture of aperture stop at an intermediate focus, and thus to an illuminator. The source and collector combination is sometimes referred to as an integrated unit called the source-collector module or SoCoMo.

This disclosure has four main aspects: 1) reducing the vulnerability of the LPP collector so that it maintains its performance for many millions of pulses of the LPP; 2) optimizing the laser target conditions to produce an optimized LPP source for EUV lithography such that the LPP has maximal EUV production from a small source region (e.g., smaller than 1 mm) and such that minimal reflected laser light is produced; 3) designing the collector system to maximize the collection of EUV radiation from the LPP to optimize the amount of EUV that is delivered to the IF aperture; 4) incorporating methods and systems to manage whatever reflected laser light is produced so that it mitigates the amount of IR that reaches the intermediate focus.

The first aspect is a SoCoMo having an LPP source with a collector configuration incorporating a debris mitigation device (DMD) placed between the LPP and a grazing incidence collector (GIC) to minimize the deposition of Sn vapor from the LPP onto the surface of the GIC. A deposition of even a few nanometers of Sn on the ruthenium (Ru) coated surface of the GIC will reduce its reflectivity at 13.5 nm. The DMD is therefore operated in a regime where the deposition of Sn vapor onto the GIC from the LPP source is severely hindered. In addition, the fast ions from the LPP source are beneficial in this scheme because they are able to pass through the DMD and sputter-clean the GIC surface of any deposited Sn and may even erode some of the Ru coating on the GIC surface, thereby maintaining a clean Ru reflecting surface.

The DMD is operated such that the Ru erosion rate is kept sufficiently small, and the thickness of Ru coating is great enough that the GIC can operate for on the order of 1 year without the Ru having to be recoated. In this way, during operation, the EUV radiation from the source always sees a "clean" Ru reflecting surface and the GIC substantially retains its performance. To achieve these conditions, the rotating vanes of the DMD move fast enough to stop the slow Sn vapor and slow Sn ions emanating from the LPP source but not fast enough to stop the fast Sn ions that clean the Ru surface.

The second aspect is the use of a laser/target configuration that maximizes (optimizes) EUV production (i.e., maximizes conversion efficiency from laser power to narrowband EUV power at a 13.5-nm wavelength) from a relatively small (i.e., smaller than 1 mm) EUV emitting region while significantly reducing the production of reflected laser light from the LPP source. This condition also reduces the EUV opacity of the LPP so that the EUV emission is substantially isotropic, thereby providing the opportunity for the SoCoMo collector system to use a larger collection solid angle. This laser/target configuration differs substantially from that used in conventional LPP EUV lithography systems.

The characteristics of this optimum condition are: the high-power laser operating at a laser wavelength of approximately 10.6 microns to illuminate an under-dense plasma (i.e., an electron density of less than $10^{19}$ e/cm$^3$ for the laser wavelength of nominally 10.6 microns), and the plasma scale length being sufficiently long (e.g., about 2 mm) to absorb all the incident laser intensity. The laser intensity at the target surface is at approximately $10^{10}$ watt/cm$^2$ for a laser wavelength of about 10.6 microns. The laser pulse length is equal to a few tens of nanoseconds.

The under-dense target plasma may be created by illuminating a low-mass Sn droplet with a precursor laser pulse and allowing the exploding target to expand to a large enough size (e.g., a few millimeters in diameter) to make the plasma under-dense. Alternatively, the under-dense plasma may be created as a Sn plasma or vapor jet having a dimension (e.g., diameter) equal to a few millimeters. Such a plasma/vapor jet may be acquired from commercial sources.

The laser/target configuration disclosed herein can yield an LPP with about 5% conversion efficiency from laser power to narrowband EUV power. The amount of reflected laser light is relatively small (e.g., much less than 10%) because the plasma is under-dense. As a consequence, there is no critical-density reflecting surface for the 10.6-micron radiation. An example size of the EUV emission region is about 0.5 mm so that it can be accurately imaged by the collection optics. The plasma opacity to EUV is only about 10%. Thus, the re-absorption of the EUV radiation by the plasma is small. These results have been simulated in 1 dimension, and the results have been found to be roughly the same in rectangular, cylindrical and spherical geometries.

The third aspect is a SoCoMo design that involves a double-sided collection of EUV radiation from the LPP source and the delivery of the collected EUV radiation to the intermediate focus (IF). This specific configuration involves adding a spherically shaped multilayer coated collector (MCC) with its center of curvature at the location of the EUV source. This allows for the radiation from the EUV source to be collected and refocused back onto itself. A first DMD (DMD1) is placed between the MCC and the LPP on the optical axis opposite from the GIC and a second DMD (DMD2) so that from left to right, the SoCoMo components are arranged in the following order: MCC+DMD1+LPP+DMD2+GIC+IF.

The first debris mitigation device DMD1 is configured to protect the MCC from being coated with tin from the LPP source. In one embodiment, a buffer gas (e.g., argon (Ar)) is used between the LPP and the DMD1 so that the fast ions from the LPP can be slowed down so they are intercepted by (e.g., swept out by rotating vanes because the ions are now slowed by the buffer gas) by the DMD1 before reaching the MCC. The DMD1 with its buffer gas is intended to stop the fast ions from reaching the MCC, whereas the DMD2 is configured and operated to allow the fast ions to pass to the GIC and sputter-clean its surface. This is necessary if the fast ions from the LPP are to be stopped by the DMD1 and are not to cause mixing of the multilayers in the top surface of the MCC.

The MCC is a spherical mirror focused back onto the LPP so that the EUV from the LPP is not significantly blocked by the rotating vane motion of the DMD1. As described above, the LPP plasma is optimized so that it has low opacity for the EUV radiation. This allows the EUV emission to be substantially isotropic and not reabsorbed by the LPP plasma when the EUV radiation is focused back onto the LPP by the MCC and passes through the LPP a second time. Under these conditions, the EUV radiation that would have been lost by heading off in the direction opposite the GIC collector is captured by the MCC and redirected back through the LPP and onto the GIC for collection and focusing onto the IF.

Thus, an aspect of this disclosure involves significantly increasing the solid angle of collection of the source-collector system by the addition of the MCC (protected by the DMD1) with focus at the LPP target position. This allows a total collection solid angle of about 10 sr (5 sr for the MCC with the DMD1 and 5 sr for the GIC with the DMD2).

The fourth aspect is directed to systems and methods for reducing the amount of reflected laser light from the LPP source that reaches the intermediate focus. A concern in any source-collector system is that, under improper illumination conditions, considerable laser infrared (IR) radiation can be reflected from the LPP source. If collected by the SoCoMo mirror(s), this high intensity laser IR will be focused through the aperture of the aperture stop located at the intermediate focus and will cause problems downstream at the illuminator, the reticle, the imaging optics and the wafer.

A number of systems and methods directed to mitigating the reflected IR problem are disclosed herein. In one example, the laser/target illumination conditions are chosen such that the amount of reflected IR is significantly reduced. In another example, the laser illumination direction is arranged to be oblique to the collector axis. Thus, even if reflected IR is produced, only a very small amount of it will be collected because it will emerge from the LPP at an angle oblique to the collector axis. Other approaches include the use of select devices (e.g., gratings, mirrors) configured to disperse any IR captured by the collectors.

Three example devices for mitigating the amount of reflected IR that can reach the aperture of the IF are:
1. A transmission grating with a period less than the wavelength of the laser radiation. In an example, a cross-grating structure reflects the IR laser light and reduces the EUV radiation by only about 10%.
2. A reflection grating superimposed on the reflecting surface of the GIC. The grating structure is configured so that virtually no IR radiation makes it to through the aperture at the intermediate focus IF. The period of the grating superimposed on the GIC is such that the laser IR radiation is diffracted out of the IF aperture. On the other hand, the much shorter wavelength EUV radiation (about 1,000 times smaller) can still be adequately focused at the aperture at the intermediate focus. A number of different grating architectures and geometries superimposed on the GIC surface are disclosed, including examples that maximize the reduction of IR radiation passing through the IF aperture while minimizing the loss of EUV radiation due to scattering from the grating surface.
3. A reflecting flat mirror (either operating at grazing incidence or multilayer coated for EUV reflection at larger angles) placed downstream of the GIC with a grating structure on it for the purpose of dispersing the IR and having virtually no IR radiation in the zeroeth order. This reduces the amount of EUV radiation at the IF aperture because of the additional mirror reflection being less than 100% (i.e., reflectivity of the added mirror at EUV wavelengths is not 100%).

U.S. patent application Ser. No. 12/803,075, entitled "Source-collector module with GIC mirror and LLP EUV light source," is incorporated by reference herein. Also the article by Fujioka et al entitled "Laser production of extreme ultraviolet light source for the next generation lithography application" (*Plasma and Fusion Research: Review Articles* 4, no. 048 [2009]) is incorporated by reference herein.

An aspect of the disclosure is source-collector module (SoCoMo) apparatus for an extreme ultraviolet (EUV) lithography system, comprising: a grazing-incidence collector having an optical axis, an input end and an output end, with an intermediate focus adjacent the output end; a low-mass target residing along the GIC optical axis at a first location; at least a first laser operably arranged to generate at least a first light pulse of first infrared (IR) radiation to the first location to irradiate the low-mass target to vaporize and ionize the low-mass target to form an initial plasma while reflecting a portion of the first IR radiation to form first reflected IR radiation; at least a second laser operably arranged to generate at least a second light pulse to irradiate the initial plasma to form a final plasma that substantially isotropically emits EUV radiation and while reflecting a portion of the second IR radiation to form second reflected IR radiation; and wherein the at least first and at least second lasers are arranged relative to the low-mass target and the GIC mirror such that at least the second reflected IR radiation remains substantially uncollected by the GIC mirror.

Another aspect of the disclosure is the SoCoMo apparatus described above, further comprising a pair of first lasers symmetrically arranged about the GIC optical axis.

Another aspect of the disclosure is the SoCoMo apparatus described above, further comprising a pair of second lasers symmetrically arranged about the GIC optical axis.

Another aspect of the disclosure is the SoCoMo apparatus described above, wherein the low-mass target comprises a tin droplet having a diameter in the range of 10 µm to 40 µm.

Another aspect of the disclosure is the SoCoMo apparatus described above, further comprising a tin droplet source configured to deliver the tin droplet to the first location.

Another aspect of the disclosure is the SoCoMo apparatus described above, wherein the GIC collects a portion of the EUV radiation and directs the collected portion of the EUV radiation to the intermediate focus.

Another aspect of the disclosure is the SoCoMo apparatus described above, wherein the final plasma has an energy in the range from about 20 eV to about 50 eV.

Another aspect of the disclosure is the SoCoMo apparatus described above, wherein the final plasma has an electron density of no greater than $10^{19}$ e/cm$^3$.

Another aspect of the disclosure is the SoCoMo apparatus described above, further comprising a first debris mitigation device operably disposed between the first location and the GIC mirror.

Another aspect of the disclosure is the SoCoMo apparatus described above, further comprising a multilayer-coated spherical mirror arranged along the GIC optical axis adjacent the low-mass target and opposite the GIC.

Another aspect of the disclosure is the SoCoMo apparatus described above, further comprising a first debris mitigation device operably disposed between the first location and the GIC mirror and a second debris mitigation device operably disposed between the first location and the multilayer-coated spherical mirror.

Another aspect of the disclosure is the SoCoMo apparatus described above, further comprising a second debris mitigation device operably disposed between the first location and the multilayer-coated spherical mirror and a buffer gas source that introduces a buffer gas between the EUV source and the second debris mitigation device.

Another aspect of the disclosure is the SoCoMo apparatus described above, wherein the at least first light pulse has a time duration in the range from 10 ns to 50 ns and an energy in the range from about 1 mJ to about 10 mJ.

Another aspect of the disclosure is the SoCoMo apparatus described above, wherein the final plasma has an emitting region with a diameter of about 1 mm or less.

Another aspect of the disclosure is the SoCoMo apparatus described above, further comprising means for reducing an amount of out-of-band radiation from reaching the intermediate focus.

Another aspect of the disclosure is the SoCoMo apparatus described above, wherein the IR radiation has a wavelength of about 10.6 microns and EUV radiation has a wavelength of about 13.5 nanometers.

Another aspect of the disclosure is the SoCoMo apparatus described above, wherein the second reflected IR radiation remains substantially uncollected by the GIC mirror.

Another aspect of the disclosure is a SoCoMo apparatus for EUV lithography system, comprising: a grazing-incidence collector having an optical axis, an input end and an output end, with an intermediate focus adjacent the output end; a high-mass target residing along the GIC optical axis at a first location and having an outer surface; at least a first laser operably arranged to generate at least a first light pulse of first IR radiation to the first location to irradiate at least a portion of the high-mass target outer surface to form an initial plasma while reflecting a portion of the first IR radiation to form first reflected IR radiation; at least a second laser operably arranged to generate at least a second light pulse to irradiate the initial plasma to form a final plasma that substantially isotropically emits EUV radiation and while reflecting a portion of the second IR radiation to form second reflected IR radiation; and wherein the at least first and at least second lasers are arranged relative to the high-mass target and the GIC mirror such that at least the second reflected IR radiation remains substantially uncollected by the GIC mirror.

Another aspect of the disclosure is the SoCoMo apparatus described above, wherein the first reflected IR radiation is substantially uncollected by the GIC mirror.

Another aspect of the disclosure is the SoCoMo apparatus described above, further comprising a pair of first lasers symmetrically arranged about the GIC optical axis.

Another aspect of the disclosure is the SoCoMo apparatus described above, further comprising a pair of second lasers symmetrically arranged about the GIC optical axis.

Another aspect of the disclosure is the SoCoMo apparatus described above, wherein the high-mass target comprises either a substantially tin droplet having a diameter of at least 100 µm or a solid object made substantially of tin.

Another aspect of the disclosure is the SoCoMo apparatus described above, further comprising a droplet source configured to deliver the substantially tin droplet to the first location.

Another aspect of the disclosure is the SoCoMo apparatus described above, wherein the GIC collects a portion of the EUV radiation and directs the collected portion to the intermediate focus.

Another aspect of the disclosure is the SoCoMo apparatus described above, wherein the final plasma has an energy in the range from about 20 eV to about 50 eV.

Another aspect of the disclosure is the SoCoMo apparatus described above, wherein the at least first light pulse has a time duration in the range from 10 ns to 50 ns and an energy in the range from about 1 mJ to about 10 mJ.

Another aspect of the disclosure is the SoCoMo apparatus described above, wherein the final plasma has a diameter of about 1 mm or less.

Another aspect of the disclosure is the SoCoMo apparatus described above, further comprising means for reducing an amount of out-of-band radiation from reaching the intermediate focus.

Another aspect of the disclosure is the SoCoMo apparatus described above, wherein the IR radiation has a wavelength of about 10.6 microns and EUV radiation has a wavelength of about 13.5 nanometers.

Another aspect of the disclosure is a grazing incidence collector for use with an EUV radiation source that emits EUV radiation and that reflects IR laser radiation used to form the EUV source, comprising: at least one mirror shell having a reflective surface with a grating having grating elements defined by sections of ellipsoids of revolution that have common foci; and wherein the grating elements are configured to substantially specularly reflect the EUV radiation to focus while substantially diffracting the IR radiation away from the focus.

Another aspect of the disclosure is the grazing incidence collector described above, wherein the grating elements are configured to cause destructive interference of a zeroeth diffraction order of the IR radiation.

Another aspect of the disclosure is the grazing incidence collector described above, further including an aperture at the focus, and wherein substantially all of the diffracted IR radiation is blocked by the aperture and wherein substantially all of the EUV radiation that is specularly reflected from the grating passes through the aperture.

Another aspect of the disclosure is the grazing incidence collector described above, wherein the grating has a period p in the range from 50 microns to 2000 microns.

Another aspect of the disclosure is the grazing incidence collector described above, further comprising a EUV reflectivity coating atop the grating.

Another aspect of the disclosure is the grazing incidence collector described above, wherein the EUV reflectivity coating consists of Ruthenium (Ru).

Another aspect of the disclosure is a SoCoMo apparatus for an EUV lithography system, comprising: a LPP EUV radiation source that emits EUV radiation and debris; a grazing-incidence collector arranged to collect a portion of the EUV radiation and direct it to an intermediate focus; and a debris mitigation device (DMD) operably arranged between the LPP EUV radiation source and the grazing-incidence collector and configured to intercept at least a portion of the debris that would otherwise be incident upon the grazing-incidence collector.

Another aspect of the disclosure is the SoCoMo apparatus described above, wherein the grazing-incidence collector includes at least one mirror shell having at least one reflective surface, and wherein the at least one reflective surface includes a grating configured to diffract infrared radiation and to substantially specularly reflect EUV radiation.

Another aspect of the disclosure is the SoCoMo apparatus described above, wherein the grating is blazed.

Another aspect of the disclosure is the SoCoMo apparatus described above, wherein the grazing-incidence collector has an input end and an output end, and wherein the grating includes elements that run longitudinally from the input end to the output end.

Another aspect of the disclosure is the SoCoMo apparatus described above, wherein the grating comprises stepwise azimuthal grating elements defined by a plurality of ellipsoids of revolution having common foci.

Another aspect of the disclosure is the SoCoMo apparatus described above, wherein the grating is configured to cause destructive interference of a zeroeth diffraction order of the IR radiation.

Another aspect of the disclosure is the SoCoMo apparatus described above, further comprising an aperture at the intermediate focus, and wherein substantially all of the diffracted IR radiation is blocked by the aperture and wherein substantially all of the specularly reflected EUV radiation passes through the aperture.

Another aspect of the disclosure is a method of forming an extreme ultraviolet (EUV) radiation source that emits EUV radiation, comprising: forming an under-dense plasma; and irradiating the under-dense plasma with infrared (IR) laser radiation having sufficient intensity to form the EUV radiation source.

Another aspect of the disclosure is the method described above, wherein the under-dense plasma has an electron density of less than $10^{19}$ e/cm$^3$.

Another aspect of the disclosure is the method described above, wherein the under-dense plasma substantially comprises tin ions and atoms and electrons.

Another aspect of the disclosure is the method described above, wherein forming the under-dense plasma includes irradiating a fuel target with laser radiation.

Another aspect of the disclosure is the method described above, wherein the fuel target comprises a tin droplet, and including allowing the plasma to expand to form the under-dense plasma.

Another aspect of the disclosure is the method described above, wherein the under-dense plasma has a dimension between 1 mm and 5 mm when it is irradiated by the infrared laser radiation.

Another aspect of the disclosure is the method described above, wherein the irradiating of the under-dense plasma is performed with at least one laser pulse having a time duration in the range from 1 ns to 50 ns.

Another aspect of the disclosure is the method described above, wherein irradiating the under-dense plasma is performed with a $CO_2$ laser and the IR laser radiation has a power density at the under-dense plasma in the range from $10^9$ W/cm$^2$ and $10^{11}$ W/cm$^2$.

Another aspect of the disclosure is the method described above, including forming the under-dense plasma as a plasma jet comprising tin ion and tin atoms and electrons.

Another aspect of the disclosure is the method described above, further comprising collecting a first portion of the EUV radiation with a grazing-incidence collector and directing the collected first portion of the EUV radiation to an intermediate focus.

Another aspect of the disclosure is the method described above, wherein the EUV radiation source emits Sn atoms, slow Sn ions, and fast Sn ions and including preventing a first portion of the Sn atoms and the slow Sn ions from reaching the grazing-incidence collector.

Another aspect of the disclosure is the method described above, wherein said preventing the first portion of Sn atoms and the slow Sn ions from reaching the grazing incidence collector including interception of the first portion of the Sn atoms and the slow Sn ions with rotating vanes operably arranged between the EUV radiation source and the grazing incidence collector.

Another aspect of the disclosure is the method described above, wherein the grazing-incidence collector comprises at least one mirror having at least one reflecting surface, and wherein the at least one reflecting surface includes a grating configured to substantially diffract IR radiation and substantially specularly reflect the EUV radiation.

Another aspect of the disclosure is the method described above, wherein the grating comprises stepwise azimuthal grating elements defined by a plurality of ellipsoids of revolution having common foci.

Another aspect of the disclosure is the method described above, further comprising reflecting a second portion of the EUV radiation with a spherical mirror directing the reflected second portion through the EUV radiation source and into the grazing incidence collector.

Another aspect of the disclosure is the method described above, further comprising preventing a second portion of the Sn atoms, slow Sn ions and fast Sn ions emitted by the EUV radiation source from reaching the grazing-incidence collector.

Another aspect of the disclosure is the method described above, wherein preventing the second portion of the Sn atom, slow Sn ions and fast Sn ions emitted by the EUV radiation source from reaching the spherical mirror includes employing at least one of a buffer gas and rotating vanes operably arranged between the EUV radiation source and the spherical mirror.

The method according to claim 59, wherein the buffer gas consists of argon at a partial pressure between 0.1 bar and 3 bar.

Another aspect of the disclosure is a method of forming an EUV radiation source that emits EUV radiation having a nominal wavelength of 13.5 nanometers, comprising irradiating a droplet comprising tin and having a diameter of 100 microns or less to produce an initial plasma; allowing the initial plasma to expand to have a diameter of about 2 mm and an ion density less than $1 \times 10^{19}$ ions/cm$^3$ and an electron density of less than $1 \times 10^{19}$ electrons/cm$^3$; and irradiating the expanded plasma of about 2 mm in diameter with at least one pulse of infrared radiation having an intensity in the range of $1 \times 10^9$ W/cm$^2$ and $1 \times 10^{19}$ W/cm$^2$ and a pulse duration in the range from 10 nanoseconds to 50 nanoseconds and a laser beam diameter of greater than about 1 mm.

Another aspect of the disclosure is the method described above, wherein irradiating the expanded plasma includes providing first and second of the pulses of infrared radiation to be incident the expanded plasma from opposite directions.

Another aspect of the disclosure is the method described above, wherein irradiating the expanded plasma includes providing multiple pulses of infrared radiation to be symmetrically incident the expanded plasma.

Another aspect of the disclosure is a method of forming an EUV radiation source that emits EUV radiation having a nominal wavelength of 13.5 nanometers, comprising: generating a plasma jet comprising Sn ions and Sn atoms and electrons, the plasma jet having a dimension of about 2 mm, an ion density less than $1 \times 10^{19}$ ions/cm$^3$ and an electron density of less than $1 \times 10^{19}$ electrons/cm$^3$; and irradiating the plasma jet with at least one pulse of infrared radiation having an intensity in the range of $1 \times 10^9$ W/cm$^2$ and $1 \times 10^{19}$ W/cm$^2$ and a pulse duration in the range from 10 nanoseconds to 50 nanoseconds and a laser beam diameter of greater than about 1 mm.

Another aspect of the disclosure is the method described above, wherein irradiating the plasma jet includes providing first and second of the pulses of infrared radiation to be incident the expanded plasma from opposite directions.

Another aspect of the disclosure is the method described above, wherein irradiating the plasma jet includes providing multiple pulses of infrared radiation to be symmetrically incident the expanded plasma.

All references cited herein are incorporated by reference herein.

In the discussion below, "µm" stands for "microns" and these two expressions are used interchangeably.

The claims and abstract are incorporated into and constitute a part of the Detailed Description set forth below.

BRIEF DESCRIPTION OF THE DRAWINGS

FIG. 8A is a close-up view of example blazed grating elements that constitute an example blazed grating formed on the GIC mirror surface;

FIGS. 8B and 8C are cross-sectional views in orthogonal planes of an example GIC mirror that includes a blazed grating configured to selectively deflect IR and EUV radiation by different amounts;

FIG. 8D is a schematic diagram of the GIC mirror of FIGS. 8B and 8C arranged relative to an EUV source, illustrating how the GIC mirror and grating deflect IR radiation and EUV radiation by different amounts, with the IR radiation being deflected such that it does not reach the aperture of the aperture stop located at the intermediate focus;

FIG. 10A is a schematic diagram of an example GIC mirror wherein the grating elements are sections of ellipsoids of revolution that have common foci associated with the location of the EUV source and the intermediate focus;

FIG. 10B is a close-up, cross-sectional view of a portion of the GIC mirror surface showing how the grating elements are arranged, and showing a step height that is used to adjust the optical path length of IR radiation to substantially eliminate the zeroeth diffraction order of the IR radiation;

FIGS. 11A through 11D are plots of the EUV conversion efficiency (%), the EUV opacity (%), the IR transmission (%), and the EUV source width (μm) within the irradiated plasma, all as a function of the ion density as a fraction of the critical ion density $n_c = 10^{19}$ ion/cm$^3$

FIGS. 13A through 13D are similar to FIGS. 11A through 11D, except that the horizontal axis is the laser pulse width in nanoseconds;

DETAILED DESCRIPTION

Figure 1A:
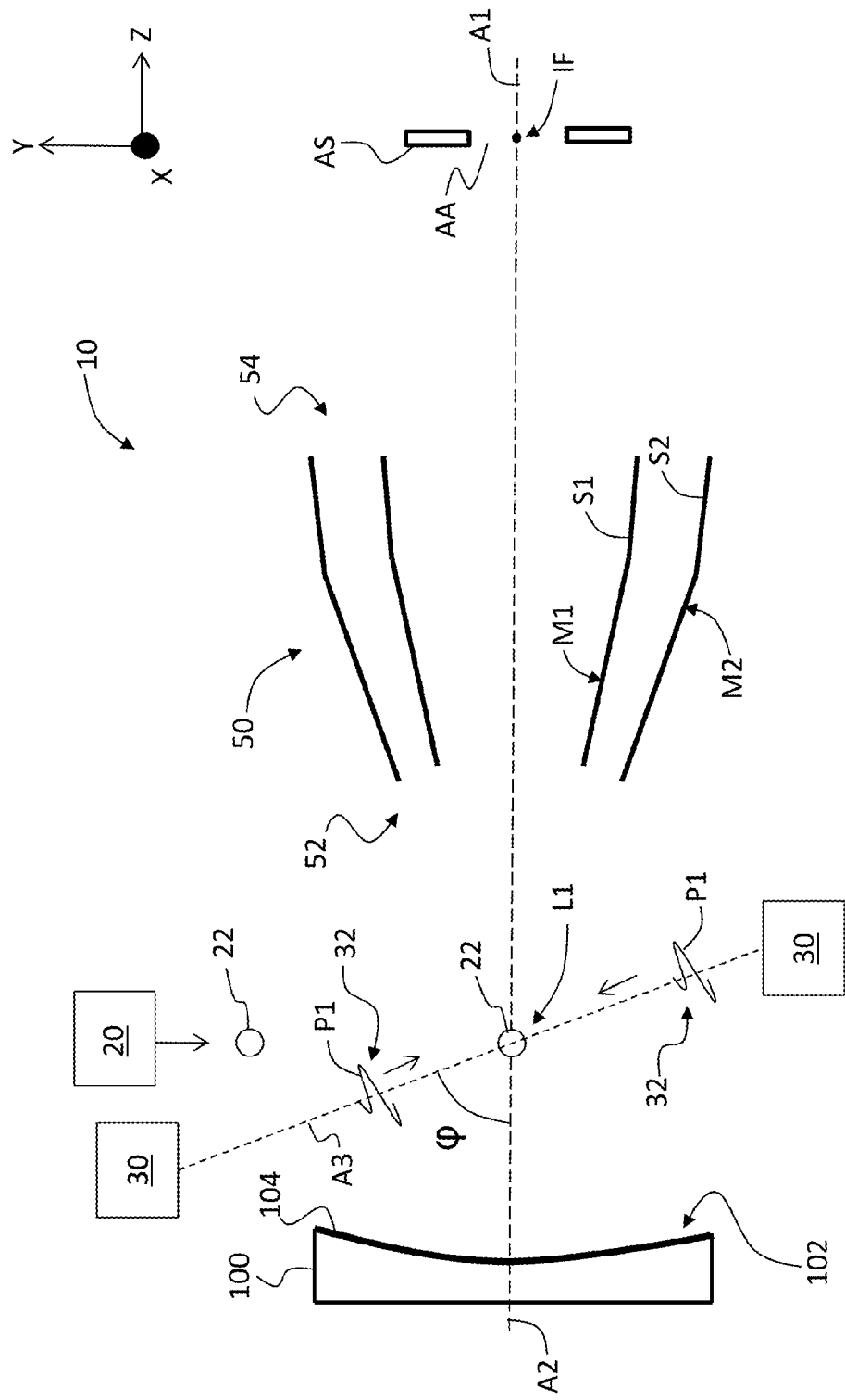
FIGS. 1A through 1C are schematic diagrams of an example embodiment of an MCC-LPP-GIC source-collector module ("SoCoMo") based on an EUV radiation source that employs a low-mass target.

The disclosure relates to EUV lithography and in particular to SoCoMo configurations for use with EUV lithography systems, wherein the SoCoMos employ an LPP EUV radiation source, and a GIC. The SoCoMos have a variety of example configurations, as explained below.

Limiting Reflected IR Collection when Using Low-Mass Target

FIGS. 1A through 1D are schematic diagrams of an example embodiment of an MCC-LPP-GIC SoCoMo ("SoCoMo") 10 that includes a GIC 50 and an optional MCC 100. The GIC 50 includes a central axis A1 and, in this example, two concentric GIC mirrors M1 and M2 shown in a cross-section. The GIC mirrors M1 and M2 have reflective surfaces S1 and S2 that include a grazing-incidence reflective coating, which in an example is formed from Ru. In an example, the reflective coating is sufficiently thick for GIC mirrors M1 and M2 to tolerate some erosion due to debris generated in the operation of the SoCoMo, as discussed below. Note that mirrors M1 and M2 are rotationally symmetric so that upper and lower portions of these mirrors are shown in the cross-sectional view of FIG. 1A and in other similar Figures showing the GIC mirrors.

The GIC 50 has an input end 52 and an output end 54 and defines an intermediate focus IF adjacent the output end and along central axis A1. An aperture stop AS with an aperture AA formed therein is located generally at intermediate focus IF. An example aperture size for aperture AA of aperture stop AS is about 4 mm. The MCC 100 has a central axis A2 that is co-axial with central axis A1 of GIC 50 and has a spherical concave surface 102 that faces GIC input end 52. The concave surface 102 includes a multilayer coating 104 configured to reflect EUV radiation. In an example, SoCoMo 10 has a magnification in the range from about 4× to about 8×.

The SoCoMo 10 includes a tin-droplet source 20 configured to deliver tin droplets 22 to a location L1 along axes A1 and A2 between GIC 50 and MCC 100. In an example, tin droplets 22 have a diameter in the range from about 10 microns to about 40 microns and therefore constitute a relatively low-mass target in which substantially all of the mass of the droplet is converted to a hot, ionized plasma when illuminated by the laser(s), thereby creating an EUV radiation source for which the EUV emission is significantly isotropic. This requires the opacity of the LPP to be less than unity, which can be achieved when the ion density is on the order of $10^{19}$ ion/cm$^3$ or less and the plasma dimension (e.g., diameter) is on the order of 1 mm or less. This is achieved by having the low-mass target as described. Examples of tin-droplet source 20 are described in U.S. Pat. No. 7,589,337, USP Pub. 2008/0179548, U.S. Pat. No. 7,718,985 and U.S. Pat. No. 6,377,651.

The SoCoMo 10 further includes at least a first laser system 30 configured to generate IR light 32 as at least one first laser pulse P1 and at least one second laser pulse P2. In FIGS. 1A through 1D, two laser systems 30 are shown arranged along an axis A3 and on opposite sides of axis A1. In one example, each laser system 30 includes a single laser than generates first and second pulses P1 and P2, while in another example, each laser system 30 includes first and second lasers (see FIG. 1D, introduced and discussed below) that respectively generate first and second pulses P1 and P2.

In an example, each laser system 30 includes a $CO_2$ laser that emits IR light 32 at about 10.6 μm. Each laser system 30 has first and second lasers that respectively emit light having a wavelength of 1.06 microns or alternatively 10.6 microns for first pulse P1 and typically 10.6 microns for second pulse P2. The first laser pulse P1 can be considered a "pre-pulse" since it has lower energy than second laser pulse P2 and is used to set the conditions for the second laser pulse to create the final EUV-radiation-emitting conditions.

In an example, axis A3 defines an angle φ that ranges from about 30 degrees to about 90 degrees relative to axis A1. The first and second laser pulses P1 and P2 are each directed to tin droplet 22 at location L1. The pulses are timed so that first laser pulse P1 arrives first and second laser pulse P2 arrives shortly thereafter, e.g., from about 0.5 μs to 1 μs later. In an example, more than one first laser pulse P1 can be used. In practice, respective trains of first and second laser pulses P1 and P2 are directed to a steady stream of tin (Sn) droplets 22 that arrive at location L1 so that there are, for example, the many thousands of EUV "flashes" per second that are necessary for meeting the average power requirements from the EUV source for the EUV lithography application.

Figure 1B:
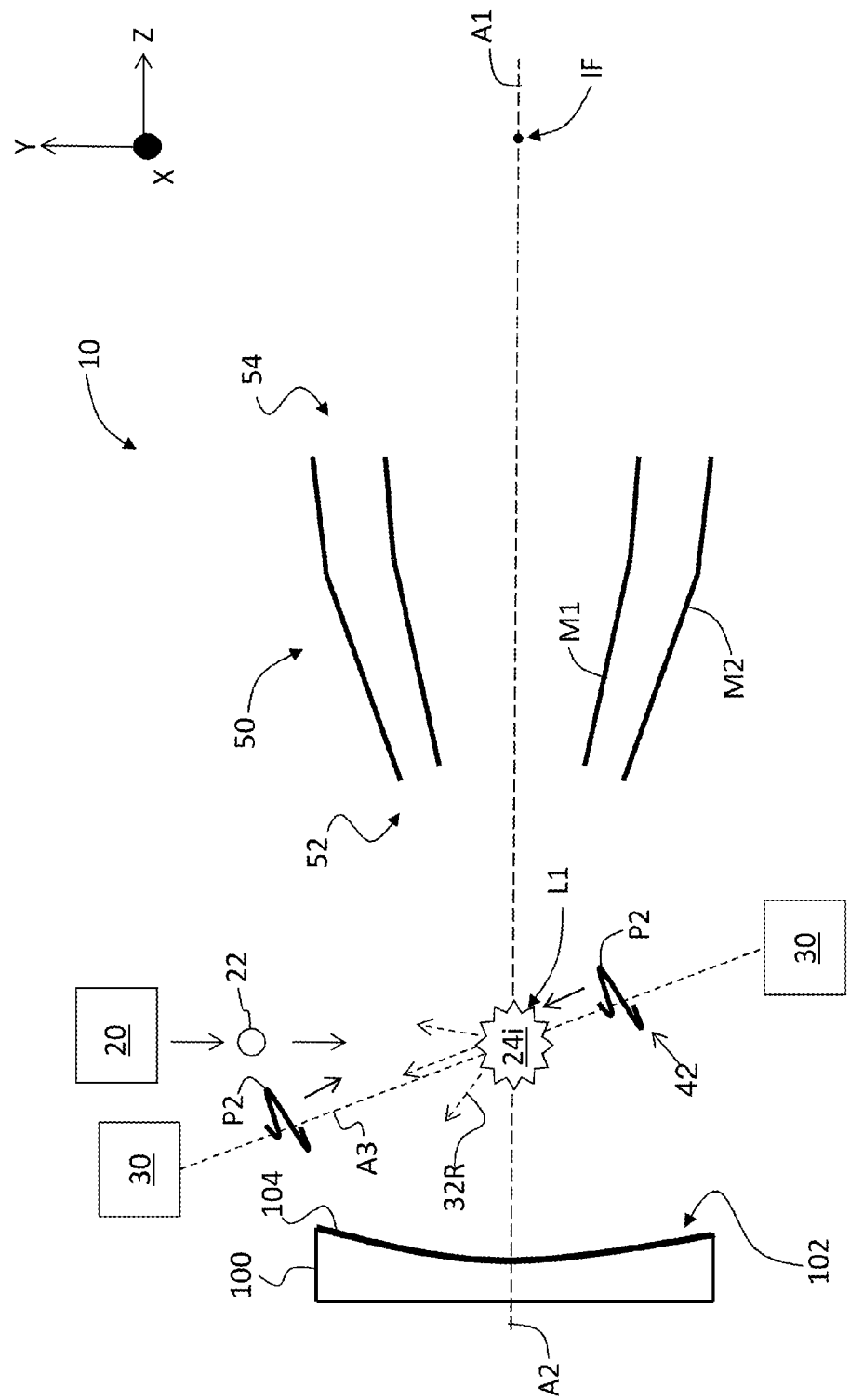
Figure 1C:
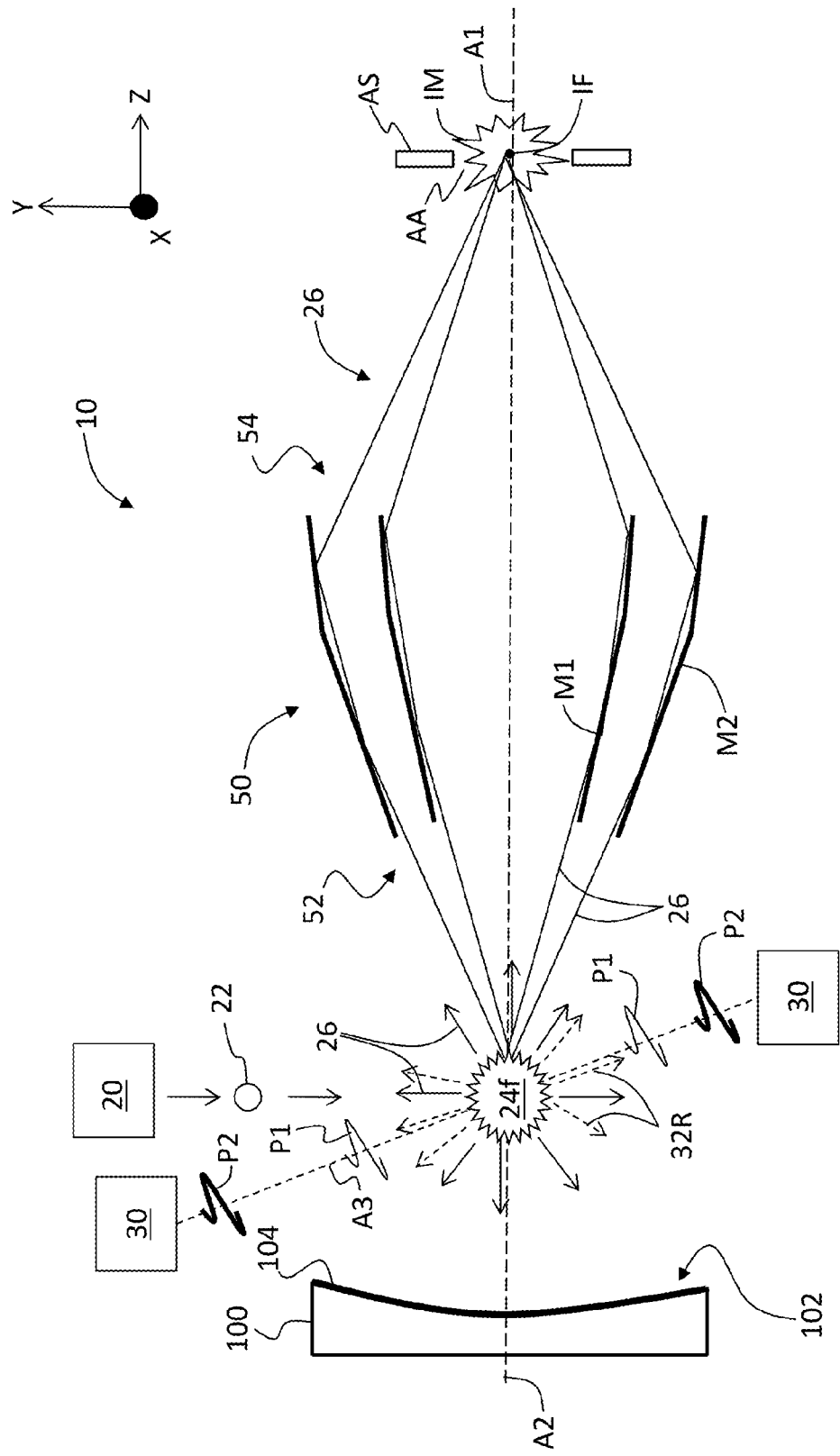

With reference to FIG. 1A and FIG. 1B, in the operation of SoCoMo 10, tin droplet 22 at location L1 is irradiated by first laser pulses P1 traveling in opposite directions toward the location on axis A1. As noted above, first laser pulses P1 may have a wavelength of 10.6 microns (e.g., from a $CO_2$ laser) or alternatively a wavelength of 1.06 microns (e.g., from an Nd laser). In an example, first laser pulses P1 have a pulse duration in the range from about 10 ns to about 50 ns, a first amount of energy in the approximate range of 1 millijoule (mJ) to 10 mJ and an incident intensity in the approximate range of $10^{10}$ to about $10^{11}$ Watt/cm². These parameters for first laser pulses P1 enable these laser pulses to vaporize and ionize tin droplet 22, as shown in FIG. 1B, thereby forming an initial tin plasma 24$i$. The initial plasma 24$i$ is near fully ionized and expands at a rate on the order of $10^5$ to $10^6$ cm/s.

With continuing reference to FIG. 1B, after initial plasma 24$i$ has expanded to a diameter on the order of a few hundred microns to perhaps as large as 1 mm or 2 mm, it is then irradiated by second laser pulses P2 that follow first laser pulses P1. The second laser pulses P2 are higher energy laser pulses (e.g., 1 to 10 joules (J)/pulse) that serve to multiply ionize and heat initial plasma 24$i$ in one example to a range of 20 eV to 50 eV (and in another example to no more than 25 eV), thereby forming a final plasma 24$f$ that is a strong emitter of EUV radiation 26 at wavelengths of around 13.5 nm. The final plasma 24$f$ also has a sufficiently low ion density $n_i$ (e.g., $n_i < 10^{19}$ ions/cm³) because fuel target 22 has low mass. Thus, there is no appreciable self-absorption of the emitted EUV radiation 26. The final plasma 24$f$ is also referred to herein as EUV source 24$f$. In one example, EUV source 24$f$ has a diameter of about 2 mm (full-width half-maximum (FWHM)) or smaller, while in another example the EUV source has a diameter of about 1 mm or smaller or 500 µm or smaller. The pulse duration of second laser pulses P2 can be in the range from 1 ns to 50 ns. In an example, pulses P2 have a diameter of about 1 mm or greater.

The symmetric creation and relatively low density of final plasma 24$f$ allows EUV radiation 26 from the final plasma to be relatively isotropic, which in turn allows for GIC mirror 50 and MCC 100 to collect an appreciable amount of the EUV radiation. In particular, final plasma 24$f$ radiates isotropically because the high-power second laser pulse P2 substantially and symmetrically irradiates the initial expanding plasma 24$i$ and is absorbed at the plasma critical surface. The plasma critical surface is the surface from which the bulk of the laser reflection occurs. For 10.6-µm laser light, the critical surface has an electron density of $10^{19}$ e/cm³. For 10.6-µm radiation, the plasma critical electron density $n_e$ is about $10^{19}$ e/cm³.

The resulting heat is conducted through final plasma 24$f$ with no appreciable momentum being transferred from the high-power second laser pulse P2. The isotropy of the emission of EUV radiation 26 is also enhanced by the low mass of target 22 and its symmetrical irradiation (i.e., irradiation from opposite directions; see e.g., FIG. 1D).

It is noted here that a distinction between the initial plasma 24$i$ and the final plasma 24$f$ is that the initial plasma is relatively cool compared to the temperature required to generate significant amounts of EUV, while the final plasma has a relatively small central region or core where the plasma is heated to the point where it generates significant EUV radiation 26 even though there is more "plasma" in the outer regions of the final plasma that does not emit EUV radiation. For ease of discussion, the entire plasma that results from irradiating the initial plasma 24$i$ with intense IR radiation is called the final plasma or EUV radiation source 26, even though one skilled in the art will recognize that the EUV radiation is substantially only emitted from the core region of this "final" plasma.

The isotropy of the emission of EUV radiation 26 from final plasma 24$f$ also depends on the angular distribution of the opacity of the final plasma at the time of EUV emission. The time over which final plasma 24$f$ emits EUV radiation 26 is generally the same as the duration of second laser pulse P2, which in an example is on the order of tens of nanoseconds. Opaque regions of final plasma 24$f$ will reabsorb some of EUV radiation 26 and can reduce the amount of EUV radiation emitted from the final plasma. However, as noted above, the relatively low-mass tin droplet 22 is substantially entirely vaporized and appropriately ionized by second laser pulses P2 such that the opacity of final plasma 24$f$ is relatively small at the EUV wavelength of 13.5 nm.

Note also that a portion of IR radiation 32 (dashed-line arrows) from first and second laser pulses P1 and P2 is reflected from the critical surface (i.e., $n_e \sim 10^{19}$ e/cm³) of final plasma 24$f$ as reflected IR radiation 32R. However, reflected IR radiation 32R is not substantially directed toward input end 52 of GIC 50 or into MCC 100 because of the oblique illumination direction of second laser pulses P2. Thus, substantially only EUV radiation 26 is focused at intermediate focus IF to form an intermediate image IM. This is because the directionality of reflected IR radiation 32R depends on the direction (and shape) of the incident high-power laser wavefronts associated with second laser pulses P2 that irradiate initial plasma 24$i$. The directionality also depends on the shape and charge characteristics of final plasma 24$f$ and the shape of the plasma critical surface.

The direction of the high-power second laser pulses P2 that irradiate tin droplet 22 at location L1 can generally be orthogonal to axis A1 of GIC 50. For example the direction could be along the X-axis. In such a case, the resulting symmetrically expanding critical surface of final plasma 24$f$ causes reflected IR radiation 32R from second laser pulses P2 to be respectively directed back generally toward the laser system 30 that emitted the pulse. Consequently, very little if any reflected IR radiation 32R is collected by GIC 50 or MCC 100.

A variety of irradiation directions for first and second laser pulses P1 and P2 can be used to achieve substantially isotropic emission of EUV radiation 26 while avoiding the collection of reflected IR radiation 32R. In general, irradiation of tin droplet 22 by first laser pulses P1 and irradiation of the resulting initial plasma 24$i$ by second laser pulses P2 should be such that the hot plasma opacity of final plasma 24$f$ is kept low and the region of 13.5-nm emission is symmetrical. In addition, the directions of irradiation of first and second laser pulses P1 and P2 are preferably maintained at a sufficiently large angle $\phi$ with respect to GIC axis A1 so that reflected IR radiation 32R is generally reflected back toward the respective laser systems 30 and not toward input end 52 of GIC 50 or toward MCC 100.

Figure 1D:
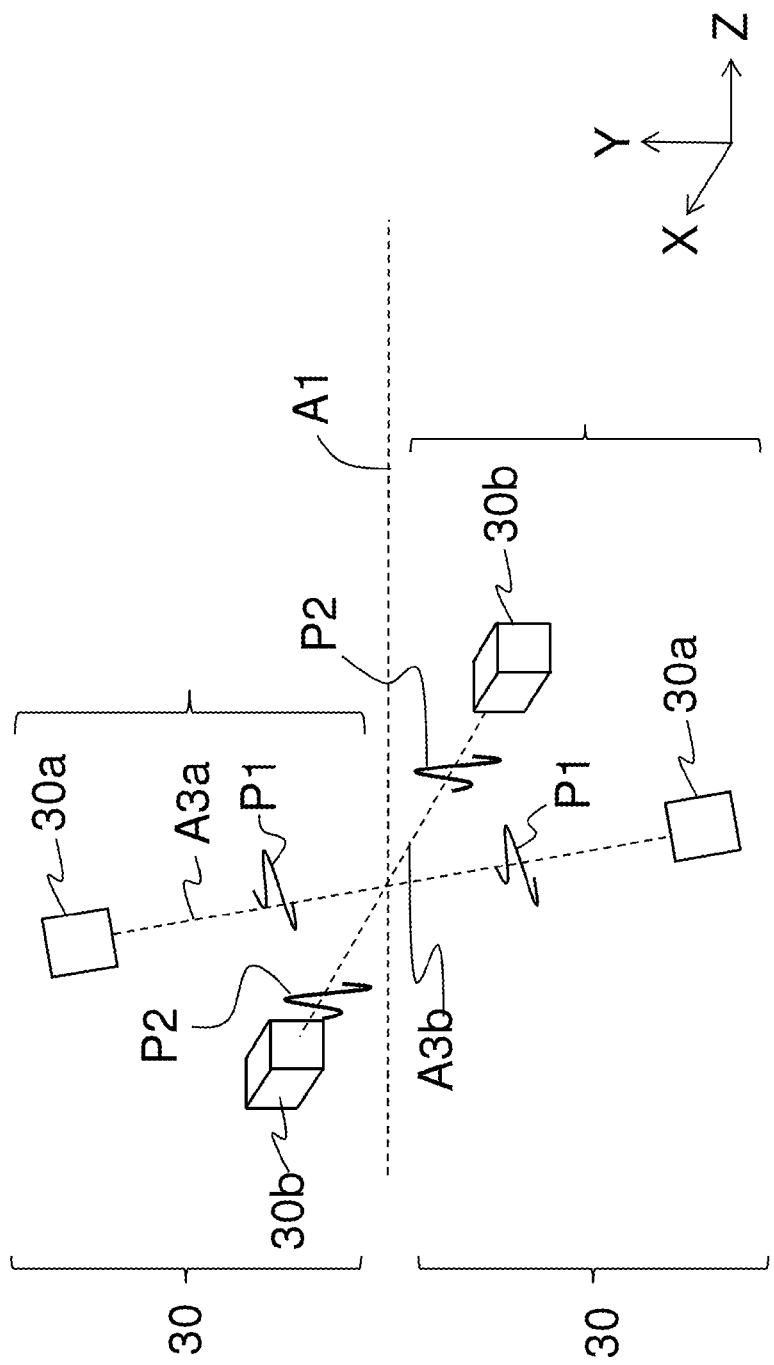
FIG. 1D is a schematic diagram that illustrates an example embodiment wherein each laser system employed in the SoCoMo includes first and second lasers to generate the first and second laser pulses.

In an example embodiment illustrated in FIG. 1D, each laser system 30 includes first and second lasers 30$a$ and 30$b$ oriented along axes A3$a$ and A3$b$ that respectively lie in the Y-Z plane and the X-Z plane. In this configuration, first laser pulses P1 are emitted along first axis A3$a$ and second laser pulses P2 are emitted along second axis A3$b$, which makes an angle with the first axis. For example, first axis A3$a$ can lie in the Y-Z plane and second axis A3$b$ can lie in the X-Z plane.

It is also noted that while IR radiation 32 associated with first laser pulses P1 is preferably focused down onto tin droplet 22 at location L1, the IR radiation associated with second laser pulses P2 need not be so tightly focused. Generally, IR radiation 32 associated with second laser pulses P2 needs to illuminate initial plasma 24$f$, which will have a larger radial extent than tin droplet 22 will.

Thus, an example embodiment of the disclosure is directed to systems for and methods of generating EUV radiation 26 without appreciable collection of reflected IR radiation 32R from first and second lasers 30a and 30b. The example method generally includes:

1. Irradiating a low-mass fuel target, such as tin droplet 22, with one or more short (i.e., about tens of ns in duration) first laser pulses P1 (pre-pulses) of infrared radiation 32 to produce initial plasma 24i generally at location L1;
2. Soon after first laser pulses P1 (e.g., hundreds of ns up to 1 μs thereafter), symmetrically irradiating initial plasma 24i with one or more higher-energy second laser pulses P2 from one or more directions that have a significant angular separation from GIC axis A1. This creates the low-density, high-temperature final plasma 24f that substantially isotropically emits EUV radiation 26, much of which is collected by input end 52 of GIC 50 and by MCC 100. The GIC+MCC system can be designed to collect as much as 10 steradians (sr) of the full 4 pi sr of EUV emission. How much of that radiation passes through the IF aperture depends on the efficiencies of the reflectors and on any obscurations in the radiation path due to debris mitigation devices. Generally, a collector system with MCC 100 and GIC 50 with DMDs can be expected at best to deliver to intermediate focus IF up to ⅓ of the narrowband EUV radiation generated at the LPP.

The optimal formation of final EUV radiation source 24f is discussed in greater detail below.

Limiting Reflected IR Collection when Using High-Mass Target

In some cases, it is preferable to use a relatively high-mass fuel target 22 rather than a low-mass target. However, separating the EUV radiation direction and the reflected IR radiation directions for a high-mass target 22 is somewhat more complex than for the low-mass target in the example described above.

Figure 2A:
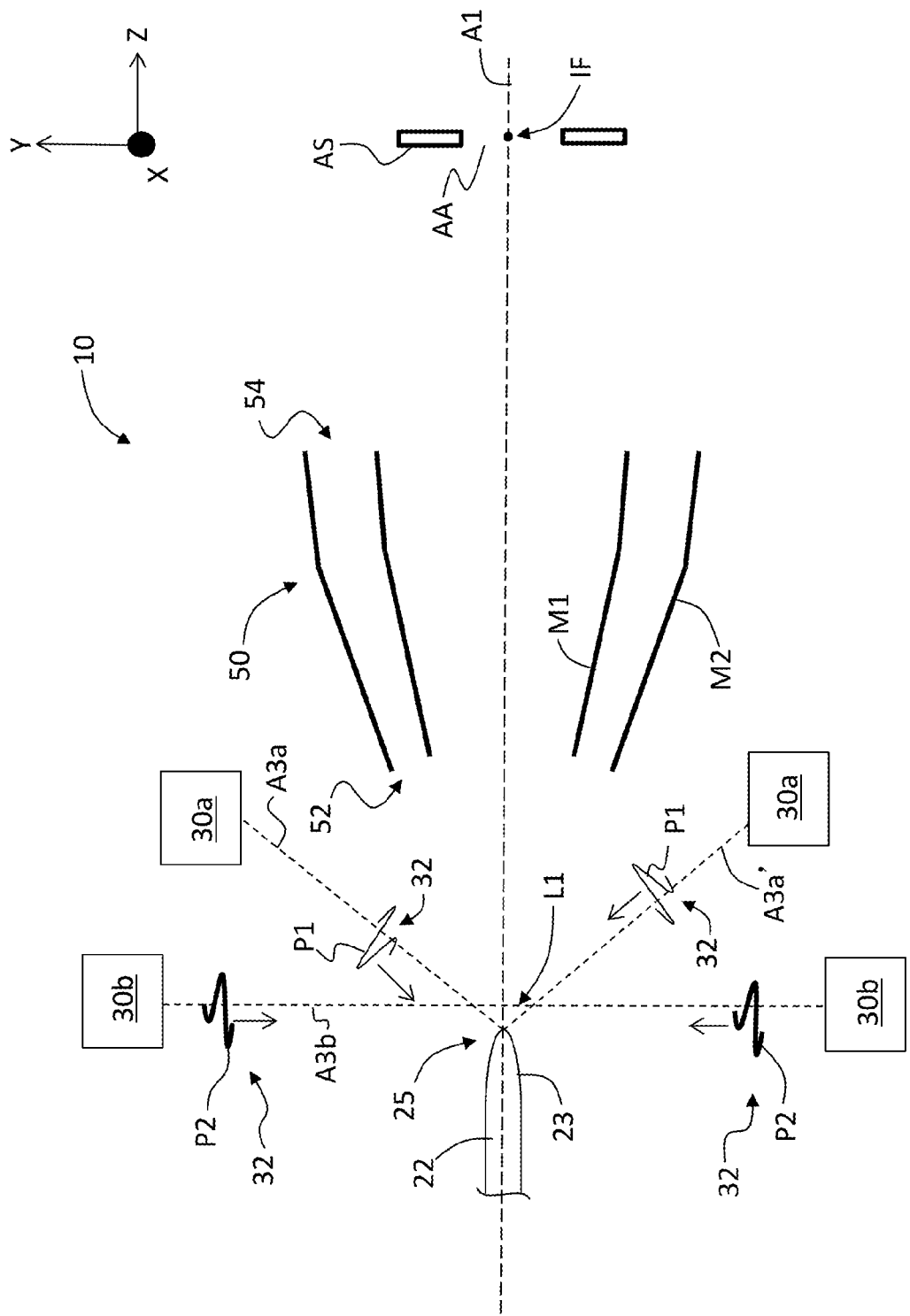
FIGS. 2A through 2C are schematic diagrams of an example embodiment of an LPP-GIC SoCoMo based on an EUV radiation source that employs a high-mass target.

FIG. 2A is a schematic diagram of an example embodiment of SoCoMo 10 that includes a relatively high-mass target 22. Here, "high mass" is defined as a target for which not all the Sn material is completely vaporized and ionized by first laser pulses P1. For such a target, the emission of EUV radiation 26 is not fully isotropic. Examples of a high-mass target 22 include a Sn metal rod or a large-diameter (e.g., at least 100 μm in diameter) Sn droplet.

The high-mass target 22 is shown as a solid body of material such as tin by way of example. The target 22 has an outer surface 23 and an end 25. Two first lasers 30a lie along respective axes A3a and A3a' on either side of GIC axis A1 and are arranged symmetrically relative to axis A1. Two second lasers 30b lie along axis A3b that in an example is perpendicular to GIC axis A1. The axis A3b intersects axis A1 a short distance away from end 25 of high-mass target 22.

Figure 2B:
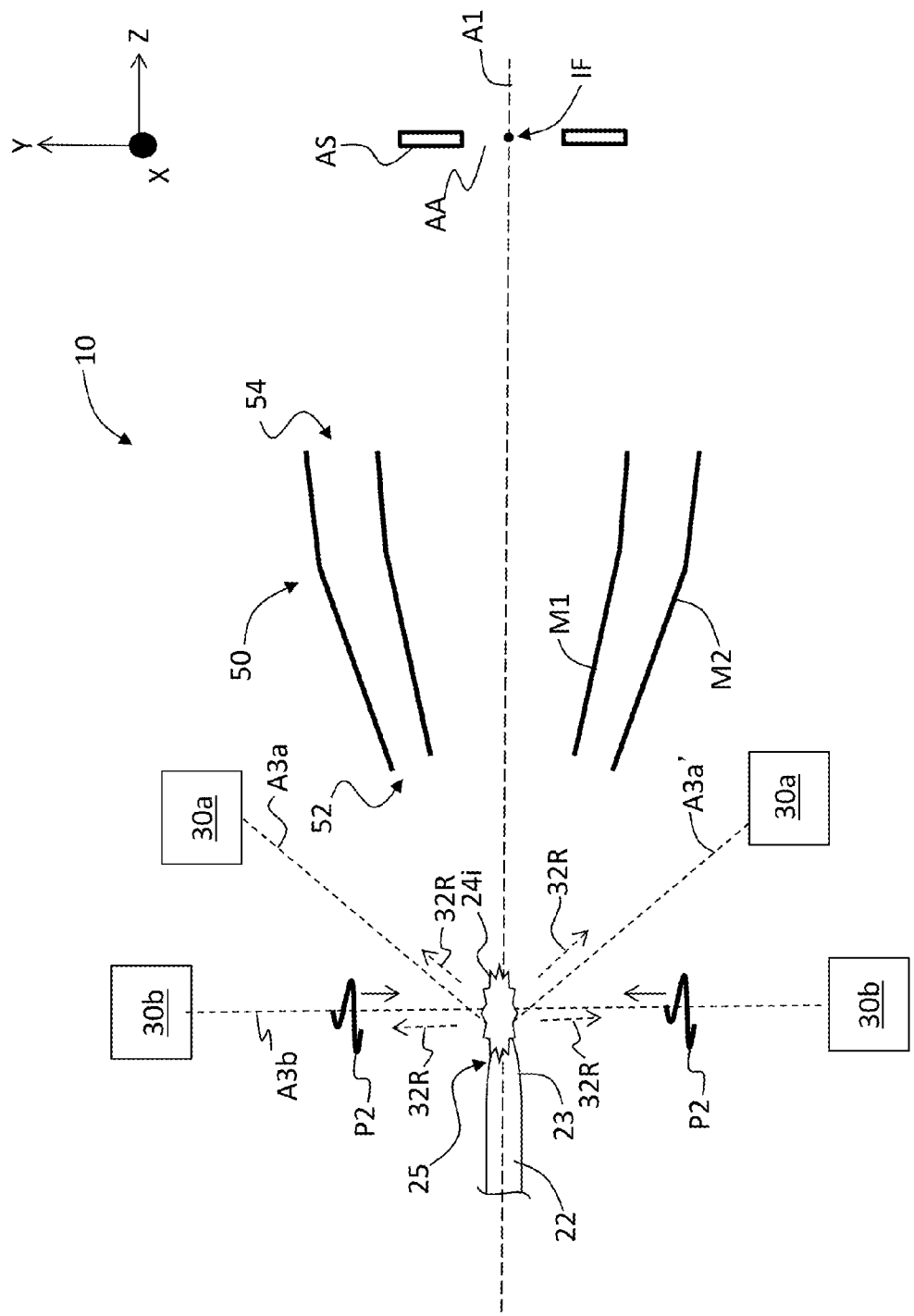

The first light pulses P1 from first lasers 30a are directed to location L1 at which a portion of target surface 23 (e.g., end 25) is located. With reference to FIG. 2B, the irradiation from first light pulses P1 creates initial plasma 24i (i.e., a blow-off plasma plume) in front of the irradiated target surface 23 (i.e., adjacent end 25). The first light pulses P1 create initial plasma 24i as a relatively low-density and low-opacity plasma plume that expands out from target outer surface 23 at location L1.

With reference to FIG. 2B, lasers 30b provide second laser pulses P2 to symmetrically irradiate substantially only initial plasma 24i from a direction oblique to axis A1.

The second laser pulses P2 reflect from the resulting initial plasma 24i as reflected IR radiation 32R. The reflected IR radiation 32R heads back in the general direction of the corresponding laser 30b. FIG. 2B shows second laser pulses P2 incident substantially only upon initial plasma 24i.

Figure 2C:
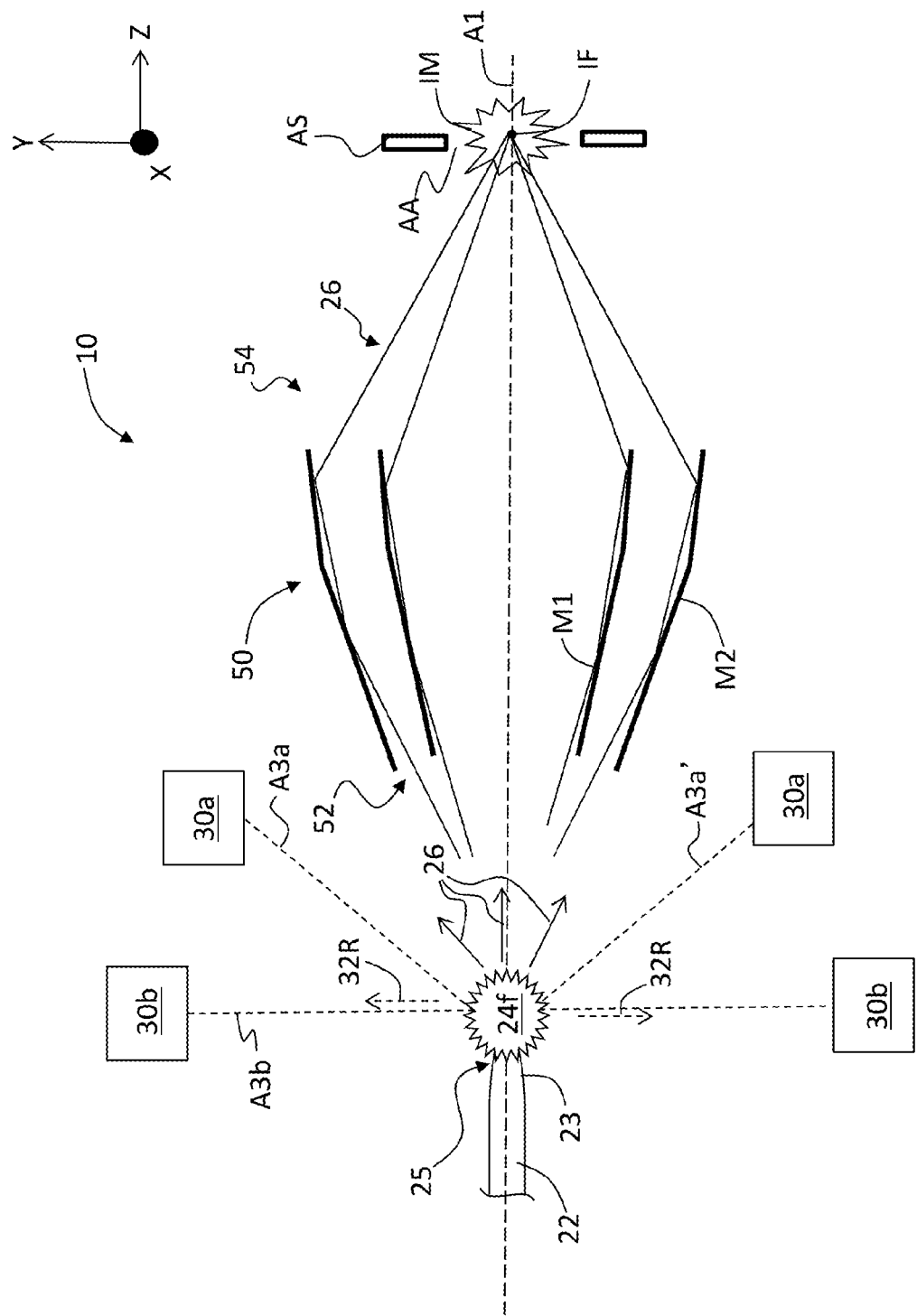

FIG. 2C shows the aftermath of the irradiation of initial plasma 24i by second laser pulses P2. The second laser pulses P2 have for example a power density of about $10^{10}$ watt/cm². The axis A3b is shown as being perpendicular to GIC axis A1, but in other examples this axis can have different but still oblique angles. The IR radiation 32 in second laser pulses P2 is absorbed at the plasma critical surface (~$10^{19}$ e/cm³), with some of the IR radiation being reflected back toward the corresponding second lasers 30b as reflected IR radiation 32R, as shown. The absorbed IR radiation 32 heats initial plasma 24i and creates final plasma 24f having a hot (e.g., from about 20 eV to about 50 eV) EUV-emitting region that emits EUV radiation 26.

Since final plasma 24f is in front of high-density target 22, the EUV emitting region of the final plasma has conditions similar to those of the low-mass SoCoMo described above, at least for the duration (e.g., tens of nanoseconds) of the high-energy, high-power second laser pulses P2.

By having an appreciable angular separation between GIC axis A1 and axes A3a, A3a' and A3b, EUV radiation 26 collected by GIC 50 is relatively undiminished while reflected IR radiation 32R generated primarily by the reflection of second laser pulses P2 remains substantially uncollected by GIC 50.

Thus, an example embodiment of the disclosure is directed to systems for and methods of generating EUV radiation 26 without appreciable collection of reflected IR radiation 32R from high-mass target 22 of lasers 30ba. The method includes:

1. Irradiating high-mass target 22 with one or more short (i.e., about tens of ns in duration) first laser pulses P1 to produce initial plasma 24i in the form of a relatively low-density, low-temperature plasma plume in front of the target. The irradiation with one or more first laser pulses P1 is preferably symmetric about GIC axis A1. In an example, first laser pulses P1 have an intensity between $10^{10}$ W/cm² and $10^{11}$ W/cm², with about 1 mJ to 10 mJ of energy, a laser wavelength of either 1.06 μm or 10.6 μm, and a pulse duration on the order of tens of nanoseconds.

2. Soon after first laser pulses P1 (e.g., hundreds of ns to 1 μs thereafter), irradiating initial plasma 24i with one or more second high-intensity laser pulses P2 from one or more directions that have a significant angular separation from GIC axis A1. The irradiation with one or more second laser pulses P2 is preferably symmetric about GIC axis A1. In an example, second laser pulses P2 have an intensity of approximately $10^{10}$ W/cm², between about 1 J and 20 J of energy, an IR wavelength of 10.6 microns, and a pulse duration on the order of tens of nanoseconds.

Debris Mitigation

In optimizing the performance of GIC 50 with the LPP EUV source 24f, there are certain architectures and processes that can be used to one's advantage. Generally speaking, a GIC is more forgiving of the Sn coating that can occur when the Sn vapor emanating from the EUV source plasma deposits onto a mirror surface than is a MCC. Nevertheless, a GIC performs best with a pristine Ru coating because the Ru has a higher grazing-incidence reflectivity over a broader range of grazing angles than does a Sn coating. The GIC is also more forgiving than the MCC of being bombarded by fast ions from the LPP. Such ions can cause mixing in the top multilayers of the MCC, thereby reducing its reflectivity. On the other hand, the fast ions serve to clean the Ru-coated GIC surface, which helps to maintain the EUV reflectivity of this Ru surface at substantially its maximum.

Figure 3A:
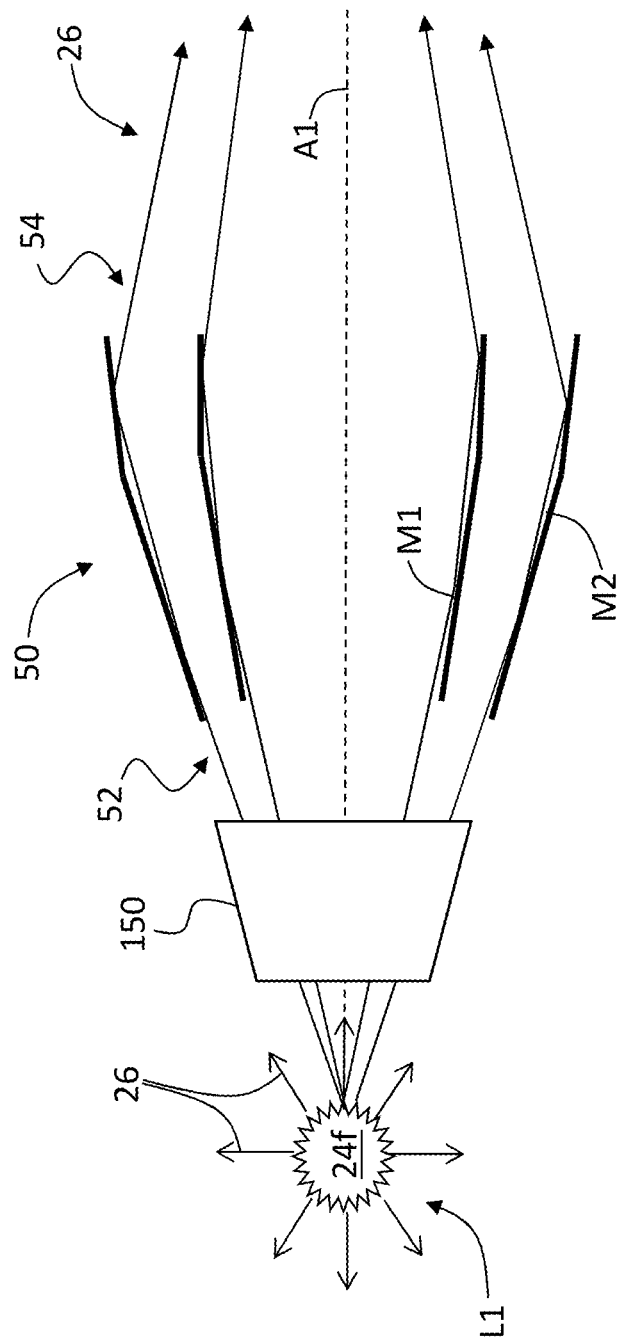
FIG. 3A is a close-up view of a portion of the SoCoMo of FIG. 1 and showing a debris mitigation device (DMD) disposed between the GIC and the EUV source.

FIG. 3A is a close-up view of a portion of an example SoCoMo 10 wherein a first debris mitigation device (DMD)

Figure 4:
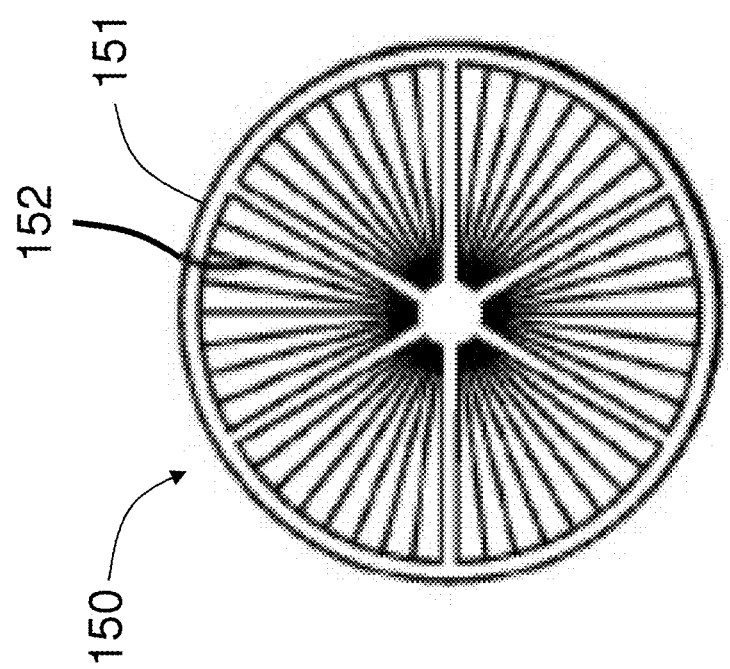
FIG. 4 is a front-on view of an example DMD showing the rotating vanes.

150 is disposed along axis A1 between GIC 50 and EUV final plasma 24f. FIG. 4 is a front-on view of an example DMD 150. The DMD 150 includes a housing 151 that operably supports vanes 152 that rotate within the housing. An example DMD 150 is disclosed in U.S. Pub. No. 2012/0305810. The DMD 150 serves to prevent the surface of GIC 50 from being coated by Sn vapor by sweeping out slow Sn atoms and slow Sn ions via rotating vanes 152.

In particular, rotating vanes 152 serve to sweep out the Sn atoms and the low-energy Sn ions in the Sn vapor before these atoms and ions can reach GIC 50. This type of DMD 150 will not stop fast ions from reaching GIC 50, but the fast ions are not problematic for the GIC's performance. In fact, as mentioned above, the fast ions can be beneficial in that they can clean the surface of GIC 50 of any Sn atoms that have migrated to the GIC surface. The rotating vanes 152 are preferably thin to minimize the amount of EUV radiation 26 that is blocked by the edges of the vanes (e.g., thin enough so that they block no more than 20% of the EUV radiation).

Figure 3B:
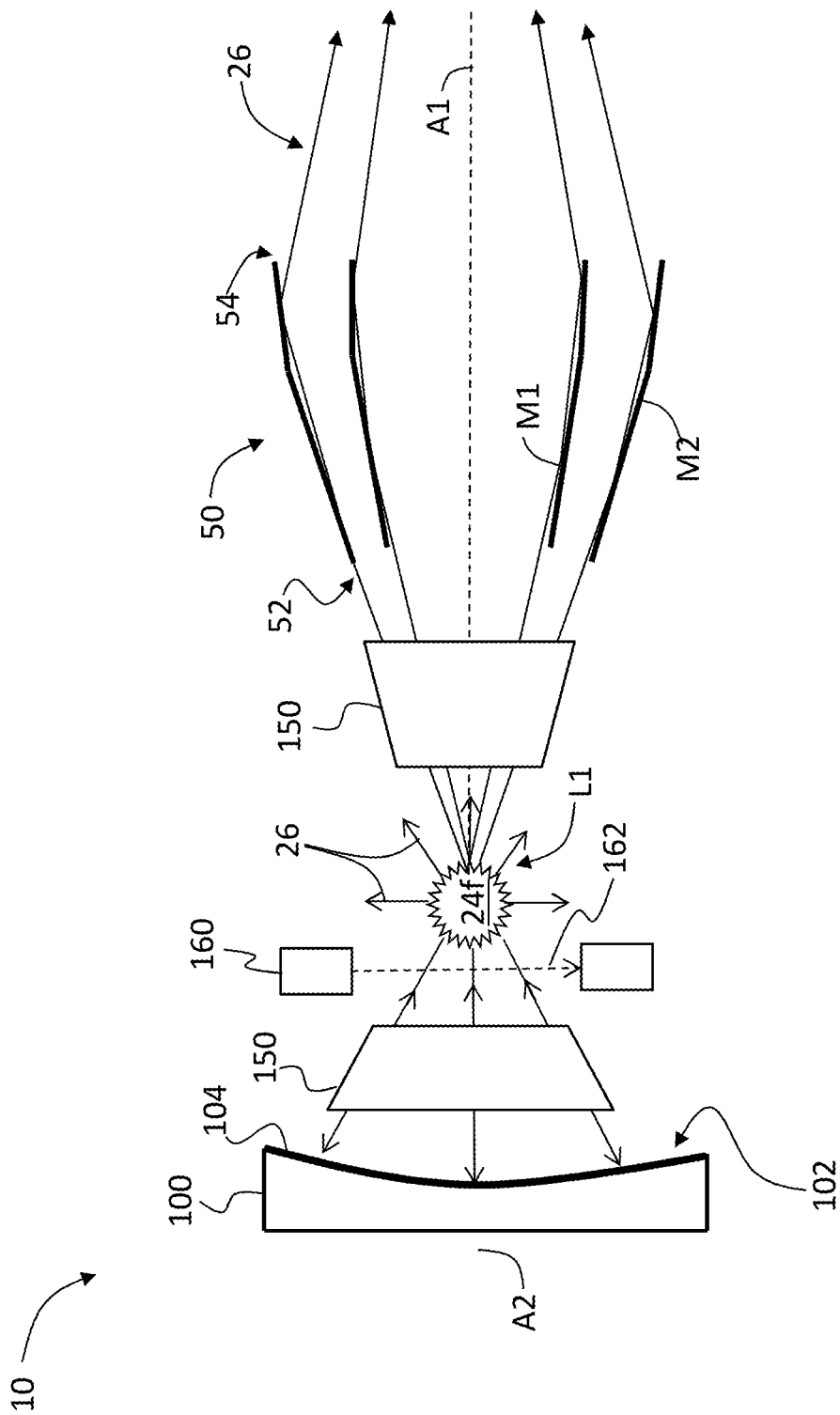
FIG. 3B is similar to FIG. 3A and additionally shows a second DMD operably disposed between the MCC and the EUV source, and also showing a buffer gas source operably disposed between the second DMD and the EUV source.

FIG. 3B is similar to FIG. 3A, except that a second DMD 150 is operably disposed between EUV source 24f and MCC 100 to prevent Sn from depositing on MCC multilayer coating 104. The MCC 100 in the example embodiment of SoCoMo 10 is a spherical mirror focused onto the center of the EUV emitting region within the LPP, which is configured to have low opacity (i.e., the plasma has EUV transparency). Consequently, the motion of vanes 152 in DMD 150 will not further block the double-pass EUV pathway that goes from LPP EUV source 24f to the MCC, then back to the LPP source, and then to GIC 50, which focuses the EUV at intermediate focus IF. This is because the EUV radiation 26 travels at the speed of light makes the round-trip path in a time so short that the vanes have no appreciable movement. So any blockage of EUV radiation 26 by DMD vanes 152 will occur only on the first passage through the DMD.

The fast ions from the LPP can be troublesome for the performance of MCC 100, and DMD 150 as proposed does not stop the fast ions because the rotational speed of vanes 152, shown in FIG. 4, required to stop the fast ions would be prohibitive. So, in an example embodiment, a buffer gas 162 (e.g., Ar) is introduced between source 24f and DMD 150. The buffer gas 162 serves to slow the fast ions so that they can be swept away by vanes 152 of DMD 150. In an example, buffer gas 162 has a partial pressure between 0.1 bar and 3 bars.

An example DMD 150 can have about 180 vanes 152 that are each 0.1 mm thick. This DMD 150 can be used to reduce the fast Sn atoms (e.g., traveling at about $2.5 \times 10^5$ cm/s) with vanes 152 that are 25 cm long and have rotational speeds of about 3,000 RPM. This DMD 150 would block about 15% of EUV radiation 26. In an example, some of the vanes 152 can be made stationary and positioned downstream of the rotating vanes.

With continuing reference to FIG. 3B, SoCoMo 10 includes a buffer gas system 160 that is arranged to flow buffer gas 162 through the region between EUV source 24f and the second DMD 150. An example buffer gas is argon. About 1 bar of argon is needed to fully thermalize the plasma expansion in 10 mm or so. Thus, at about 0.1 bar, ions with an energy of about 15 eV (i.e., traveling at $5 \times 10^5$ cm/s) have their energy decreased by a factor of two or greater, which makes the ions sufficiently slow to allow them to be captured by the second DMD 150.

In a different example embodiment in which GIC 50 is used in SoCoMo 10 without DMD 150, the GIC is designed to optimize its collection performance when coated with Sn. The optical design of a GIC 50 optimized for a Sn coating is different from the optical design of a GIC 50 optimized for a Ru coating. However, the collection efficiency performance of the design that is optimized for the Sn coating is reduced by approximately 50% compared to the collection efficiency performance of a design optimized for the pristine Ru coating. In this regard the combination of EUV LPP source+DMD+GIC is better than just an EUV LPP source+GIC optimized for performance with a Sn coating.

Reducing the Amount of IR Radiation and/or OOB EUV Radiation Reaching IF

Aspects of this disclosure are directed to additional mechanisms for improving the practical performance of SoCoMo 10 by limiting the amount of IR radiation that is collected and focused at intermediate focus IF and/or the amount of out-of-band (OOB) EUV radiation that is collected at the intermediate focus.

Figure 5A:
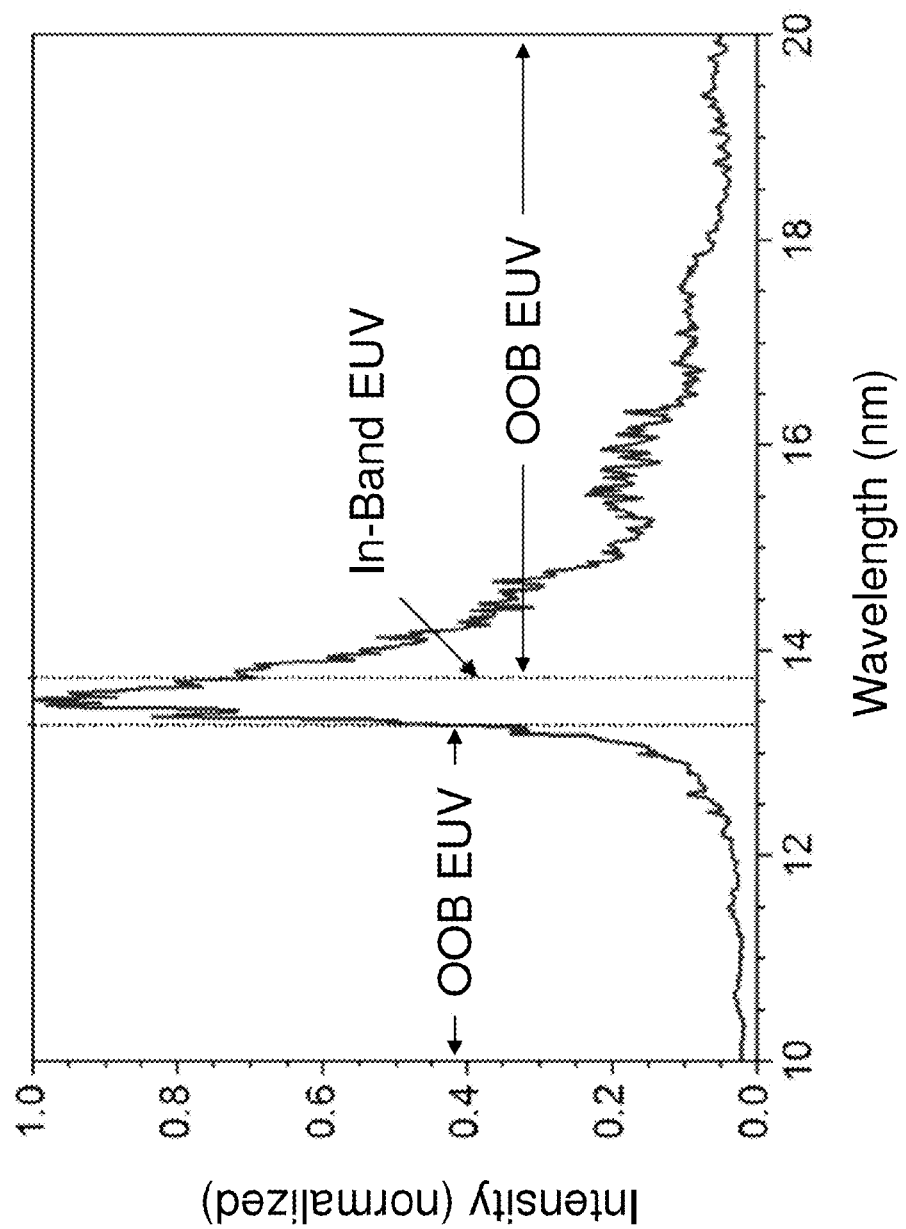
FIG. 5A is a plot of normalized intensity versus wavelength (nm) that represents the emission spectrum of an example EUV source, and showing the in-band EUV region and the out-of-band (OOB) EUV regions.

FIG. 5A is an example plot of the intensity (normalized) as a function of wavelength (nm) for an example EUV source 24f. The plot of FIG. 5A is the emission spectrum of the example EUV source 24f and shows the "in-band" EUV centered around 13.5 nm with a bandwidth of about 0.5 nm. The EUV radiation outside of this band is the OOB EUV radiation. The amount of power in the OOB EUV radiation between 10 nm and 20 nm is about ten times greater than the amount of power in the in-band EUV.

Transmissive Filter for Restricting IR

Figure 5B:
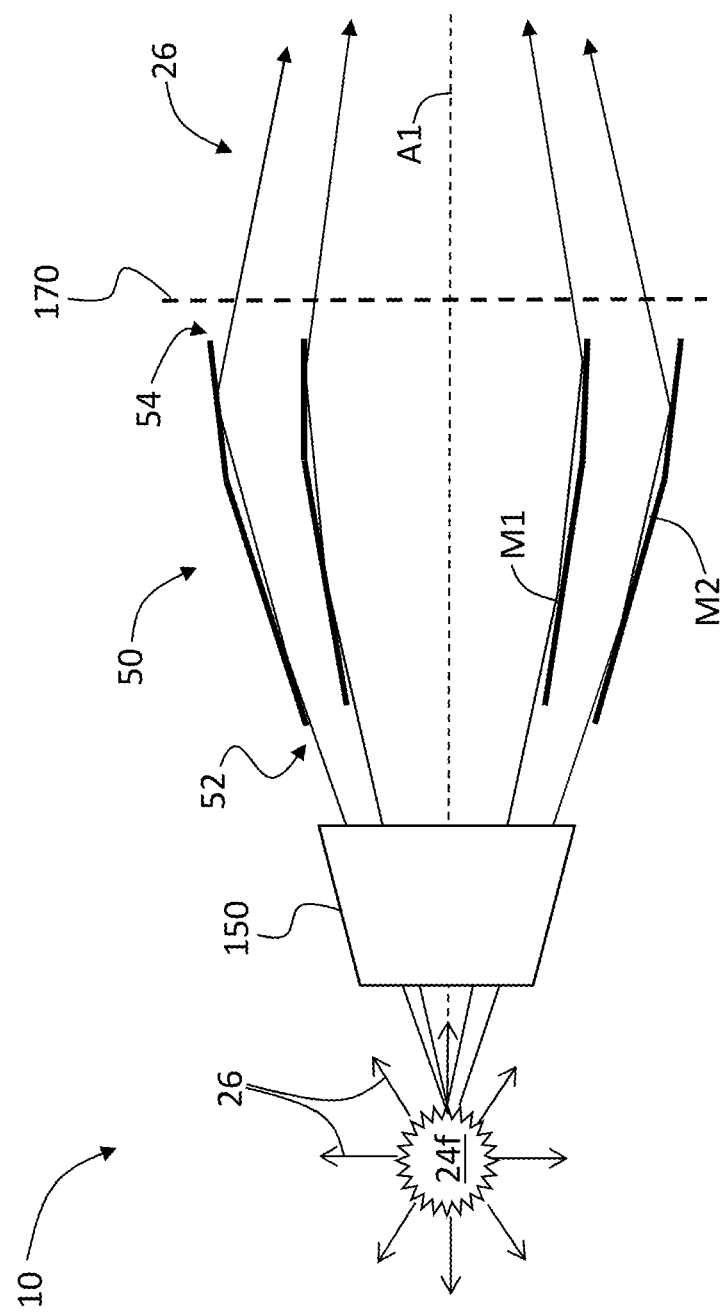
FIG. 5B is similar to FIG. 3A but also shows the SoCoMo as including a grating operably arranged at the output end of the GIC and configured to substantially block the transmission of IR radiation while substantially transmitting EUV radiation.

FIG. 5B is similar to FIG. 3 and shows SoCoMo 10 as additionally including a grating 170 disposed adjacent output end 54 of GIC 50. The grating 170 is configured to reflect or disperse reflected IR radiation 32R while substantially transmitting EUV radiation 26 at 13.5 nm. Such a structure can be used as an IR filter grating placed downstream of GIC 50 but before the illuminator (not shown). In the example of FIG. 5B, grating 170 is placed adjacent output end 54 of GIC 50.

For example, grating 170 can be formed as a periodic transmission grating with conductive lines in the vertical direction that would act as a polarizer for all radiation with wavelengths longer than the period of the grating. The E field component parallel to the vertical grating lines (and thus in the vertical direction) would be primarily reflected (some component would be absorbed by the grating because the grating material is a non-ideal conductor) and the E field component in the horizontal direction would pass through the grating (i.e., have a polarizing effect). So, using crossed gratings 170 would reflect both polarization components for radiation with wavelengths greater than the period of the grating.

If grating 170 has a 9:1 space-to-line ratio, then approximately 81% of the EUV radiation 26 would be transmitted, considering the grating lines are in both the vertical and horizontal directions. To keep such a grating structure from being thermally overloaded and melting, it can be placed where EUV radiation 26 and IR radiation 32 is spread over a relatively large area (for example, close to the output end 54 of GIC 50). Covering such a large area would reduce the power/cm$^2$ incident on grating 170. In addition, grating 170 could be rotated into and out of the IR beam and/or cooled.

Reflective Filter for OOB EUV Radiation

Figure 6A:
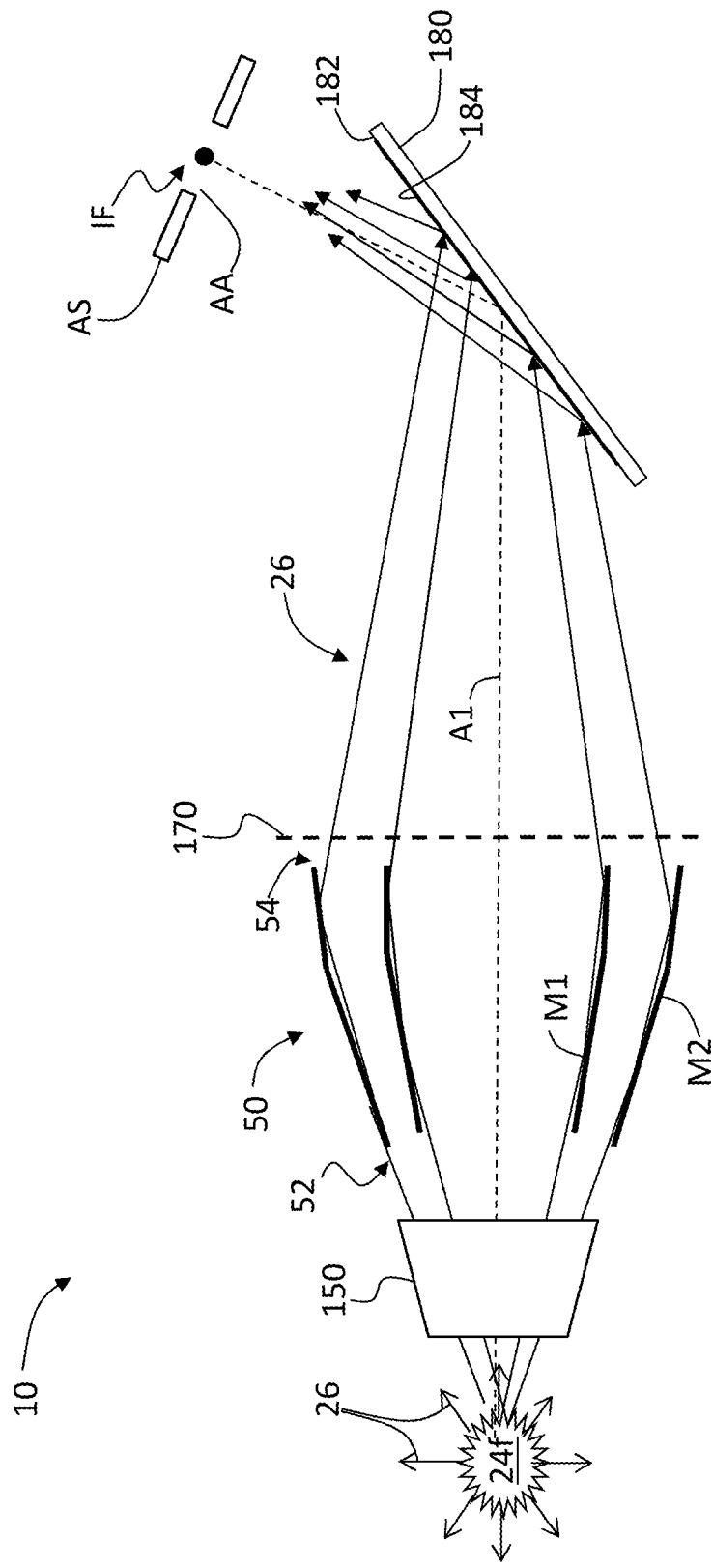
FIG. 6A is similar to FIG. 5B and shows the SoCoMo as further including a reflective filter arranged near the intermediate focus and configured to substantially prevent OOB EUV radiation from reaching the intermediate focus.

FIG. 6A is similar to FIG. 5B and shows SoCoMo 10 as additionally including a reflective filter 180 with a multilayer coating 184 formed on an upper surface 182. The reflective filter 180 is arranged along axis A1 adjacent output end 54 of GIC 50 and downstream of grating 170 toward intermediate focus IF. The reflective filter 180 can be configured to filter out the reflected IR in addition to other out-of band (OOB) radiation being reflected by GIC 50 by including a dispersive reflective grating structure on the surface of the reflective filter. The reflective filter 180 is arranged at an angle relative to GIC axis A1. In examples in which there is no dispersive reflective grating structure on the surface of reflective filter 180, the reflective filter then filters only EUV OOB radiation and not IR radiation.

Figure 6B:
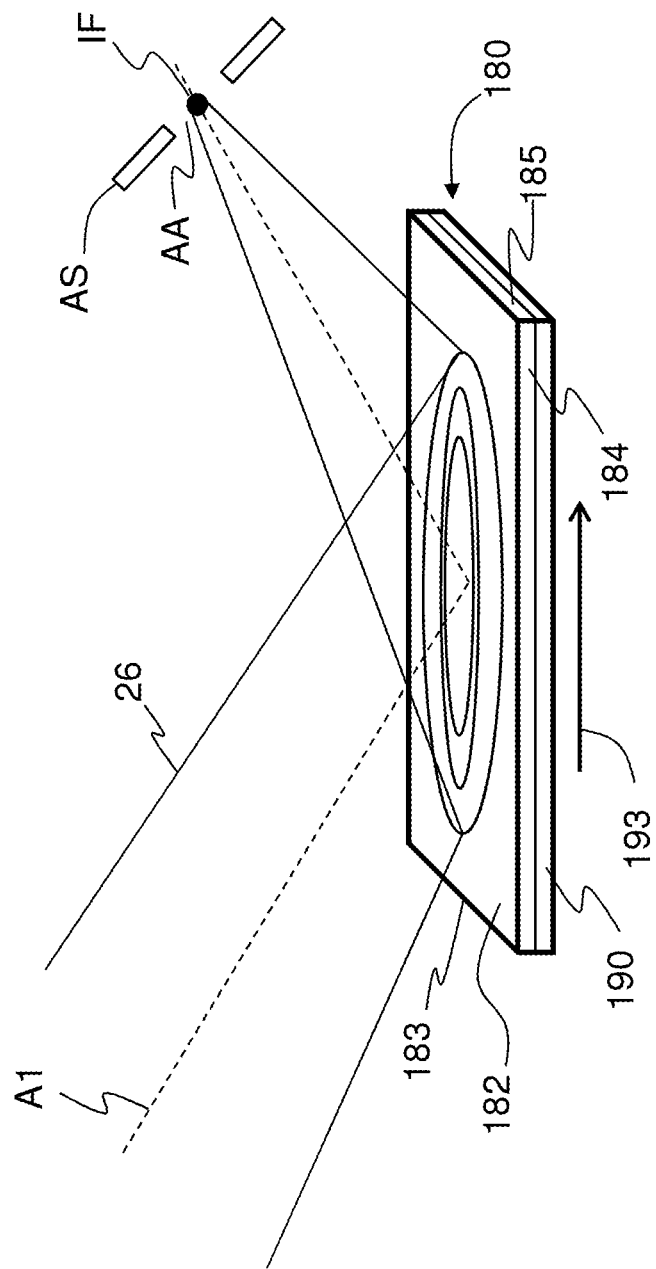
FIG. 6B is a close-up, elevated view of an example of the reflective filter of FIG. 6A.

FIG. 6B is an isometric view of an example reflective filter 180 having the aforementioned upper surface 182, as well as a leading edge 183 and a trailing edge 185. The example reflective filter 180 includes a flat member (e.g., a mirror) 190 with a linearly graded, reflective Mo—Si multilayer coating 184 formed thereon. An arrow 193 shows the direction in which multi-layer coating 184 is graded. An example multi-layer coating 184 can have for example twenty or so layer pairs. The annular distribution of EUV radiation 26 as formed by GIC 50 having multiple mirror elements is shown on upper surface 182.

Figure 6C:
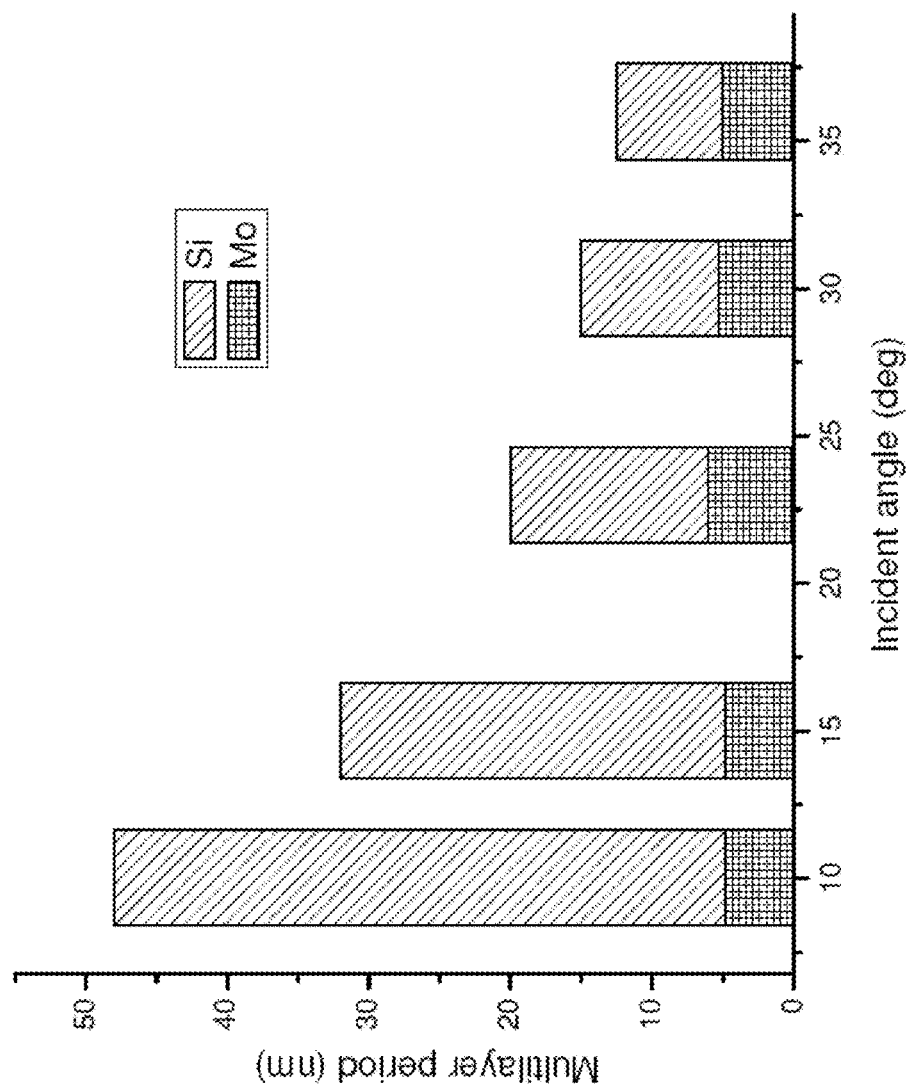
FIG. 6C is a plot of the multilayer period (nm) versus incident angle (degrees) of EUV light incident upon the reflective filter, showing how the multilayer coating has different amounts of molybdenum (Mo) and silicon (Si) associated with the grading of the multilayer coating as a function of incident angle.

FIG. 6C is a plot of the multilayer period (nm) versus incident angle (degrees) of EUV radiation 26 on reflective filter 180. The plot of FIG. 6C shows how the proportions of Si and Mo change with the incident angle (i.e., in the direction of arrow 193). Note from FIG. 6C how the Mo layer thickness is fairly constant and the Si layer thickness is strongly graded. This particular reflective filter 180 filters only OOB EUV radiation.

Figure 6D:
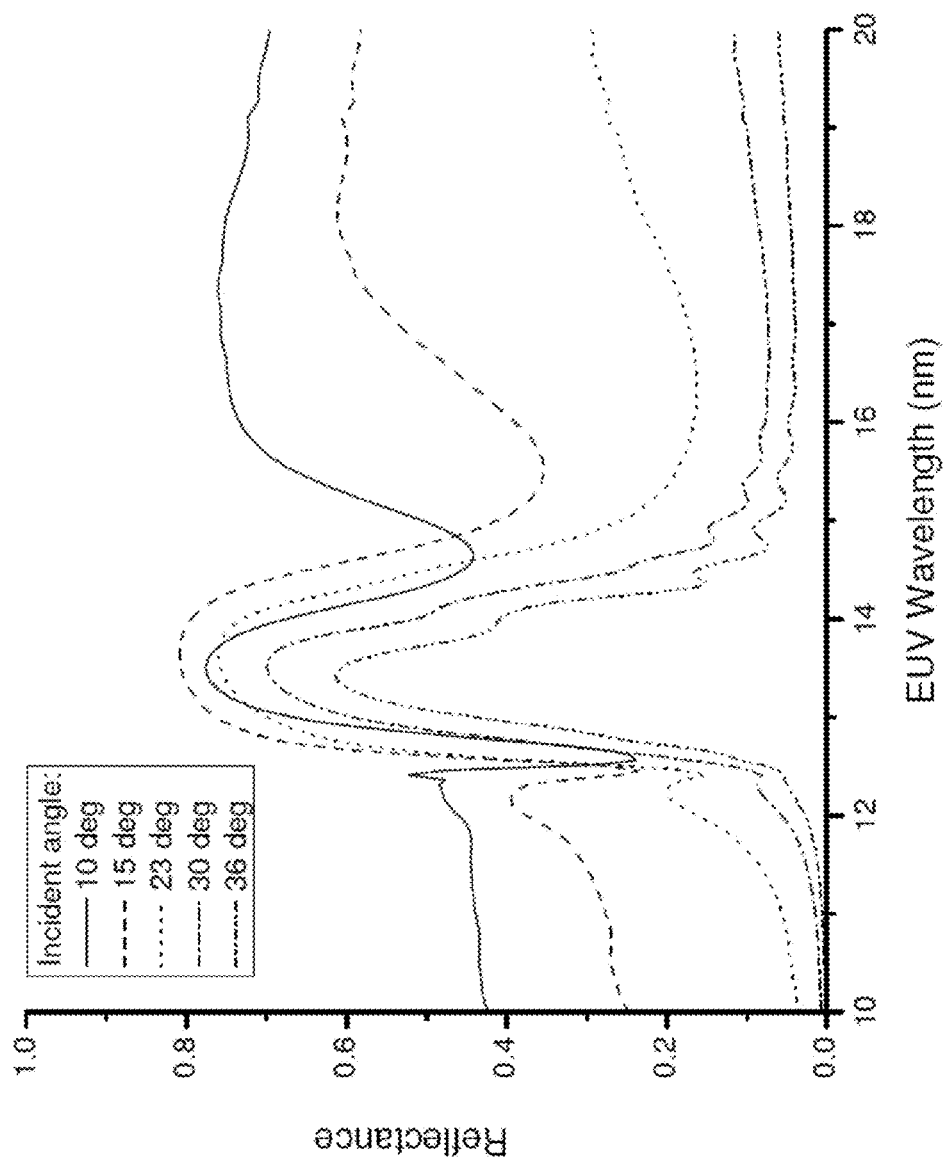
FIG. 6D is a plot of the reflectance versus EUV wavelength (nm) for an example reflective filter made up of an Mo—Si multilayer coating, for different values of the incident angle over a 26-degree range from 10 degrees to 36 degrees.

The Si—Mo coating multilayer coating 184 must accommodate the full acceptance angle associated with intermediate focus IF, which in an example is about 26 degrees. Hence the angle of incidence of EUV radiation 26 on reflective filter 180 varies continuously between the angular extremes, with incident angles increasing with the distance from GIC 50. As an example, consider a minimum angle of incidence of 10 degrees at leading edge 183 of reflective filter 180 and a maximum angle of 36 degrees at trailing edge 185. Using the Mo and Si layer thicknesses plotted in FIG. 6C, the bandpass for reflective filter 180 for the case of 20 layer pairs was calculated and is shown in the plot of reflectance versus EUV wavelength (nm) in FIG. 6D. It can be seen that the reflectance is designed to peak at the in-band wavelength of 13.5 nm and effectively suppresses the OOB EUV emission, particularly at the higher incidence angles.

Thus, in an example reflective filter 180 is formed by a plurality of thin-film coatings configured to resonantly reflect EUV radiation 26 at 13.5 nm while in other cases the reflective filter is configured to absorb the reflected IR and other OOB radiation. The reflective filter 180 can also be configured to disperse IR radiation by placing on its surface a suitable EUV reflection grating modulated to disperse the IR.

Figure 7:
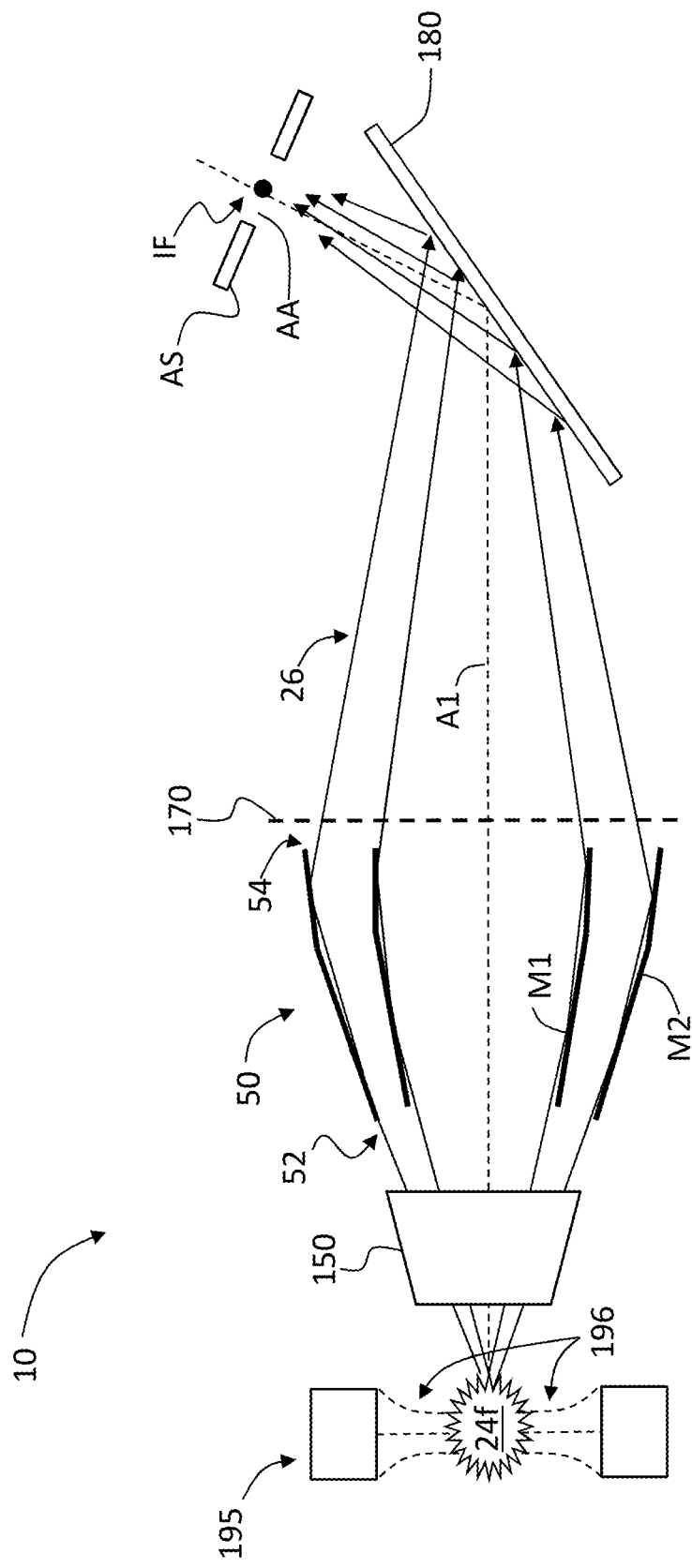
FIG. 7 is similar to FIG. 6A and illustrates an example SoCoMo that includes a magnetic DMD arranged relative to the EUV source.

FIG. 7 is similar to FIG. 5B and shows SoCoMo 10 as additionally including a magnetic trap 195 operably arranged relative to final EUV plasma 24f. The magnetic trap 195 includes a magnetic field 196 (dashed lines) that serves to trap charged particles and direct them away from GIC 50 so that they do not enter input end 52 of the GIC. An example magnetic trap 195 that can be modified such that it is suitable for use in SoCoMo 10 is disclosed in U.S. Pub. No. 2009/0261242.

GIC Grating to Reduce IR Radiation Collection

In an example embodiment, the amount of IR radiation 32 that is collected by GIC 50 and directed to aperture AA of aperture stop AS is reduced and in some cases substantially eliminated by including a grating on the GIC. FIG. 8A is a close-up, cross-sectional view of an example grating structure ("grating") 106 that including grating elements 105 that have a height d and a length 2L. FIG. 8B shows a cross-sectional view of mirror M1 of GIC 50 where grating 106 is formed on mirror surface S1. In an example, grating 106 is blazed, as shown in FIGS. 8A and 8B.

The grating 106 may be imposed onto the surface of at least one mirror in GIC 50 to disperse IR radiation 32 (including reflected IR radiation 32R) so that it does not reach the aperture AA of aperture stop AS at intermediate focus IF while also not substantially dispersing EUV radiation 26. In this way the illuminator, reticle, wafer, etc. can be protected from the damaging IR reflected from the LPP while not significantly reducing the amount of EUV radiation 26 that passes through aperture AA. FIG. 8C is a top-down view of GIC 50, showing an example of how grating 106 is configured to accomplish its function of dispersing IR radiation while not substantially dispersing EUV radiation.

The difference in the amount of dispersion of IR radiation 32 versus EUV radiation 26 is due to the large difference between the wavelengths these two forms of radiation, which differ by almost a factor of 1,000. The diffraction angle $\theta$ scales with the ratio of the radiation wavelength $\lambda$ to the grating period p (i.e., $\theta \sim \lambda/p$ radians). This allows the grating period p (which might typically be between 50 and 2000 microns, or between 100 and 500 microns, or between 200 and 400 microns) and the geometry of SoCoMo 10 to be configured so that the first and zeroeth orders of diffraction of the IR radiation are well separated, while the small angular diffraction of the EUV radiation (wherein $p \gg \lambda_{EUV}$) leaves the EUV beam narrowly focused. Separation of IR radiation 32 and EUV radiation 26 can be achieved either by blazing grating 106, or in embodiments, by configuring the grating to diminish the zeroeth order of the IR radiation through destructive interference.

To minimize the loss of EUV radiation 26 at intermediate focus IF and aperture stop AS, in an example the reflecting surface of grating 106 is smoothed and polished to minimize the scattering of EUV radiation. If the surface of grating 106 is smooth enough to minimize scattering of EUV radiation 26, then the amount of surface scattering of IR radiation 32 will be very small because the surface scattering scales strongly with the inverse of the wavelength of the radiation.

In an example, grating 106 is configured on GIC 50 such that there is virtually no IR radiation 32 in the zeroeth order. This is accomplished by configuring grating 106 such that destructive interference occurs at the zeroeth order. The condition arises when the optical path difference from EUV source 24f to GIC 50 and then to intermediate focus IF between equivalent rays on adjacent grating elements 105 are an odd multiple of half the IR wavelength (e.g., $\lambda/2=5.3$ microns for a $CO_2$ drive laser with a wavelength of 10.6 microns).

In an alternative embodiment, grating 106 is blazed such that the narrow EUV radiation beam can be separated from the zeroeth order of the IR radiation. With reference to FIG. 8D, in this case, the EUV radiation is focused at intermediate focus IF, which now does not lie along GIC axis A1 and is not coincident with any of the diffracted higher orders of the IR radiation. The aperture AA of aperture stop AS is located at an off-axis position (i.e., not along GIC axis A1). The IR radiation 32 on the other hand is focused by grating 106 to an on-axis location away from aperture AA of aperture stop AS. In this case of the blazed grating 106, the focused EUV radiation 26 passes through aperture AA of aperture stop AS at intermediate focus IF, while virtually all the IR radiation 32 is blocked at the IF plane by aperture stop AS and so does not pass through aperture AA.

With reference again to FIG. 8A, the blazed grating 106 is designed to apply a linear phase shift across the optical wavefront, thereby providing an angular shift to the EUV diffraction pattern. The grating period p produces a line of focal spots at the intermediate focus plane corresponding to the different diffraction orders. Of course, the angular separations of the diffraction pattern for IR radiation 32 and EUV radiation 26 will be very different because of the large difference in their wavelengths. For example, if the period of the grating (p=2 L in FIG. 8A) is 100 microns, then according to the grating equation, where $\theta_m$ is the diffraction angle for the $m^{th}$ order and $\theta_i$ is the angle of incidence measured from the normal of a GIC focusing mirror (e.g., mirror M1):

$$m\lambda = p(\sin\theta_m - \sin\theta_i)$$

The diffraction orders for IR radiation 32 will be separated by 6 degrees (in the case of $\theta_i=0$ degrees). In contrast, the diffraction orders for EUV radiation 26 at 13.5 nm will be separated by only 0.0077 degrees. Since the EUV diffraction spots are so densely packed, EUV radiation 26 will have a direction defined by the blaze of grating 106, essentially specularly reflecting off of the blaze surfaces (grating elements 105). If the reflection from the blaze is selected to be at an angle that is in-between the diffraction orders for IR radiation 32, then the focused EUV radiation 26 can be spatially separated from the IR radiation, as shown in FIG. 8D.

Note that in FIG. 8D, the direction of IR radiation 32 corresponds to the zeroeth order diffraction. The diffracted orders of IR radiation 32 would appear as focused spots above and below GIC axis A1. Note there is no azimuthal symmetry to blazed grating elements (lines) 105, as shown in FIGS. 8B and 8C. The EUV radiation 26 is tightly focused. The GIC 50 is tilted by the blaze angle so that EUV radiation 26 is directed to aperture AA of aperture stop AS.

Another way of understanding the configuration of blazed grating elements 105 and the above condition is to consider the coherence length and short wavelength of EUV radiation 26. The coherence length of the EUV radiation 26 is quite small and is not longer than the grating period p, making the diffractive effect of the grating negligible for the EUV radiation 26. The location in the IF plane at which EUV radiation 26 is focused by GIC 50 is determined essentially by specular reflection from the blazed grating surfaces. This allows substantially all EUV radiation 26 collected by GIC 50 to be passed through aperture AA of aperture stop AS at intermediate focus IF.

The wavelength of IR radiation 32 on the other hand is on the order of the grating period p and its coherence length is many grating periods. Consequently, the diffractive effects of grating 106 on IR radiation 32 are significant. Since the blaze angle of the grating does not correspond to an allowed IR diffraction angle, this results in virtually no IR radiation 32 being directed in the same direction as EUV radiation 26.

To summarize, and as shown in FIG. 8D, the zeroeth order of diffracted IR radiation 32 is focused along GIC axis A1, with the higher diffractive orders of the IR radiation being displaced from and located on either sides of the GIC axis but not located so as to pass through aperture AA of aperture stop AS. The EUV radiation 26 is directed in a direction dictated by the blaze in grating 106. The GIC 50 can be tilted relative to intermediate focus IF and aperture stop AS so that EUV radiation 26 is directed into aperture AA of IF aperture stop AS.

In an example embodiment, the blazed grating 106 formed on surface 51 of mirror M1 of GIC 50 (as well as on other surfaces of other GIC mirrors in a nested GIC configuration), grating elements 105 have the geometry shown in FIGS. 8A through 8D to achieve the linear phase shift of the optical wavefront. Note that grating elements 105 are not azimuthally symmetric around GIC axis A1. Such symmetry could not achieve the off-axis placement of EUV radiation 26, as shown in FIG. 8D.

As shown in the side cut-away view of FIG. 8B, grating elements 105 are horizontal and evenly spaced. However, in the top view of FIG. 8C (wherein the top view direction is defined by the line connecting GIC axis A1 and the EUV focal spot), grating elements 105 are curved and their separation varies continuously. These grating elements 105 are defined by the intersection of the planes of constant phase shift (introduced by the blaze) with the surface of GIC 50. Since the phase shift is linear from top to bottom, the intersections are the straight lines shown in the side view of FIG. 8B. In the top view of FIG. 8C, the intersections are slices through the surface of GIC 50. That is, if GIC 50 were a cone, then the top-view curves would be conic sections and if the GIC were an ellipsoid, then they would be ellipsoidic sections.

The fabrication of the blazed grating 106 of FIGS. 8A through 8D can be accomplished by diamond turning the pattern onto the master mandrel of GIC 50. As discussed above, the blazed reflecting surfaces are then polished (e.g., using ion-beam polishing) to sub-nanometer smoothness on the master mandrel to maintain the efficient reflection of EUV radiation 26. The GIC shells (mirrors M1, M2, . . . ) can then be electroformed onto the patterned mandrel and released. The blaze surfaces on the GIC shells are subsequently to be coated with the aforementioned Ru reflector material for the EUV GIC application.

It is noted in the side views of FIGS. 8B and 8D that grating elements 105 have opposite polarity on opposite sides of the GIC mirror M1. As can be seen in FIG. 8D, this causes obscuration of some of the EUV rays on the lower portion of the GIC mirror. This obscuration reduces the reflection efficiency of the GIC with respect to EUV radiation 26.

Figure 9A:
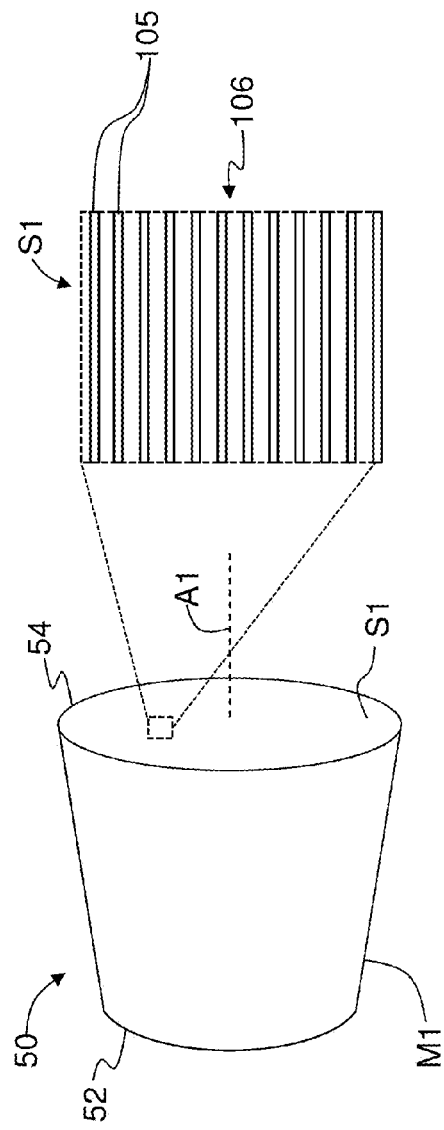
FIG. 9A is a side elevated view of an example GIC mirror that has a grating formed on its reflecting surface, wherein the elements of that grating run longitudinally from the input end to the output end of the GIC.
Figure 9B:
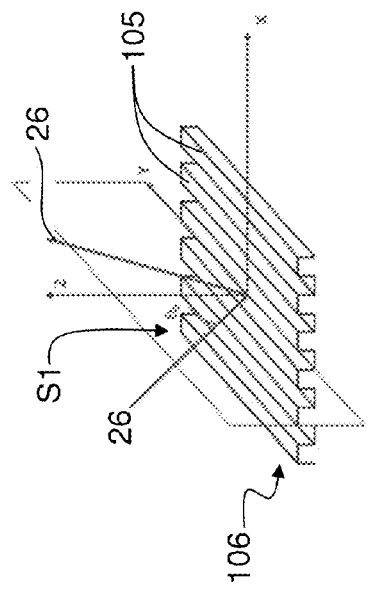
FIG. 9B is a close-up elevated view of an example section of the longitudinal grating, illustrating how EUV radiation specularly reflects from the grating due to the period being much larger than the EUV wavelength.

FIG. 9A and FIG. 9B illustrate another configuration for grating 106 on GIC 50 wherein the grating elements 105 formed in surface S1 run longitudinally from the GIC input end 52 to the GIC output end 54. FIG. 9A shows a close-up view of surface S1 showing a portion of grating 106, which in an example covers the entire reflecting surface. This configuration of grating 106 avoids the problem of obscuration of the EUV radiation traveling from the source to the GIC (except for skew rays, which are few given the relatively small size of EUV radiation source 24f).

FIG. 9B shows a portion of grating 106 on surface S1 along with an example EUV radiation ray 26. The EUV radiation 26 specularly reflects from grating 106 because the diffractive effect on the EUV radiation is negligible owing to its wavelength being much shorter than the grating period p, while the EUV coherence length is not much larger than the grating period. On the other hand, the diffractive orders of the IR radiation 32 are diffracted in the X-Z plane because the IR wavelength is of the order of the grating period and the coherence length of the reflected IR is much longer than the grating period p.

Because grating 106 is not blazed, a different configuration than that described above must be used to eliminate the zeroeth order of the IR radiation, which otherwise travels in the direction of specular reflection direction and thus towards aperture AA of aperture stop AS. Grating 106 is thus configured so that the optical path difference from EUV source 24f to GIC 50 to aperture AA of aperture stop AS between equivalent rays on the top and bottom portions of the longitudinal grating is an odd multiple of half the IR wavelength (e.g., for $\lambda=10.6$ microns, then $\lambda/2=5.3$ microns). This ensures destructive interference of the IR radiation 32 at aperture AA of aperture stop AS.

For a ray incident upon the longitudinal grating 106 at angle $\theta$ (measured from the normal to the grating), the depth of the grating needs to be an odd multiple of $\lambda/(4\cdot\cos(\theta))$, where λ is the IR wavelength (e.g., λ=10.6 microns for $CO_2$ drive laser). Under these conditions, the EUV radiation 26 is focused into aperture AA of aperture stop AS while there will be no substantial IR radiation 32 that passes through the aperture AA. This is because the zeroeth order diffraction of IR radiation 32 undergoes destructive interference and the higher orders are diffracted into circles around aperture AA of aperture stop AS, with the higher order diffraction angles satisfying the above grating equation.

The fabrication of the longitudinal grating 106 can be accomplished by forming the corresponding grating onto a GIC master mandrel used to form the GIC. Since conventional diamond turning systems have a lathe type mechanism, an alternative precision milling machine may be used to write the longitudinal grating structure. The reflecting surfaces of grating 106 are preferably polished (e.g., using ion beam polishing) to sub-nanometer smoothness to minimize the scattering of EUV radiation. The GIC mirrors are then electroformed onto the patterned mandrel and released. The grating surfaces are then coated with the aforementioned Ru reflector material for the EUV GIC application.

FIG. 10 illustrates another example embodiment of the configuration of grating 106 formed on surface 51 of GIC mirror M1. Grating structure 106 is shown patterned onto a single ellipsoid GIC mirror M1 by way of example. A number of different ellipsoids E1 through E4 (dashed lines) are shown for reference. Ellipsoids E1 through E4 have common foci where the EUV source 24f and intermediate focus IF reside. That is to say, they represent a family of ellipsoids with common foci. The grating elements 105 are formed to be portions of ellipsoids E1 through E4. The grating period p is defined by the length of each grating element 105 and is on the order of the wavelength of IR radiation 36 and thus the period is much larger than the EUV wavelength and larger than the EUV coherence length. Grating elements 105 thus define a stepwise azimuthal grating.

Consequently, the EUV radiation 26 is specularly reflected by grating 106 and is focused by each of the grating elements 105 (i.e., ellipsoidal segments) to intermediate focus IF. The IR radiation 32 is diffracted by the periodic grating elements 105 so that the nonzero diffracted orders will form circles around and outside aperture AA of aperture stop AS. The grating period p is selected so that the non-zero diffracted orders of the reflected laser IR radiation 32 fall outside the diameter of aperture AA of aperture stop AS, whereas all the diffracted orders of the EUV radiation 26 fall inside the IF aperture.

To minimize the amount of zeroeth order IR radiation reaching aperture AS of aperture stop AS at the intermediate focus IF, grating elements 105 are configured with step heights $H_S$ so that the optical path difference from the EUV source 24f to the GIC mirror surface S1 to the intermediate focus IF for corresponding rays on adjacent grating elements are an odd multiple of half of the IR wavelength. The non-zero diffracted orders of the reflected IR form circles around aperture AA of aperture stop AS at radii larger than aperture AA, which in an example is about 4 mm or less in diameter.

This example configuration of grating 106 on GIC mirror M1 can be formed by diamond turning the corresponding grating structure onto a GIC master mandrel. As discussed above, the figured grating surfaces must then be polished (e.g., using ion beam polishing) to sub nanometer smoothness on the master mandrel to maintain the efficient reflection of the EUV radiation. The mirrors M1, M2, ... of GIC 50 can then be electroformed onto their respective patterned mandrels and released. The figured grating surfaces on the shells of GIC 50 would subsequently be coated with the aforementioned Ru reflector material for the EUV GIC application.

It is noted that grating elements 105 of grating 106 are defined by segmented ellipsoids of revolution about GIC axis A1. There is no loss of EUV radiation 26 due to obscuration by grating elements 105. Every ray from EUV source 24f has an unobscured path to a grating element 105 and then to IF aperture top AS. Conventional diamond-turning techniques can be used to fabricate GIC 50 having grating 106.

Considerations in Optimally Forming the EUV Radiation Source

An aspect of the disclosure includes forming EUV radiation source emitting region 24f in an optimal manner. Such an optimally formed EUV radiation source emitting region 24f has the following characteristics:

1) Minimal reflection loss of the laser IR radiation 32 that is incident upon initial plasma 24i and that has sufficient energy to create the final plasma EUV emitting region 24f. The IR laser irradiation 32 (e.g., pulse P2) is used to heat the initial plasma 24i and bring it to a temperature high enough to produce EUV radiation 26 having a nominal wavelength of 13.5 nm.
2) Maximum conversion efficiency from laser power to EUV power at 13.5 nm, which depends on good absorption of the IR laser radiation incident on the initial plasma 24i and minimal loss of the IR radiation due to reflection of laser light from the irradiated plasma.
3) A relatively small size, e.g., less than 1 mm, and preferably about 0.5 mm in diameter d (see FIG. 14), for ease in imaging the EUV source region into the aperture AA at intermediate focus IF.
4) A relatively low plasma opacity for the EUV radiation emitted from region 24f so that it can be emitted substantially isotropically, thereby enhancing the opportunity for large solid angle collection of the EUV radiation.

One-dimensional numerical simulations were carried out to investigate the above characteristics in connection with forming an optimum EUV radiation source emitting region 24f from a tin fuel target. FIGS. 11A through 11D are plots of the EUV conversion efficiency (%), the EUV opacity (%), the IR transmission (%), and the EUV source width (μm) within the irradiated plasma, all as a function of the ion density as a fraction of the critical ion density $n_c = 10^{19}$ ion/$cm^3$ The simulations were carried out based on initial plasma 24i being irradiated with a high-intensity CO2 laser pulse (i.e., second pulse P2). To minimize the reflection of IR radiation, the plasma density in the simulations was maintained below the critical plasma electron density $n_c$, which for $CO_2$ laser radiation is $10^{19}$ e/$cm^3$. The fractional ion density ρ is defined as $\rho = N_{ion}/n_c$ where $N_{ion}$ is the actual ion density of the plasma. The duration of second pulse P2 was varied. The laser spot area (i.e., the nominal diameter of second laser pulse P2) is dictated by the plasma diameter, and the energy in second pulse P2 is dictated by EUV radiation production. If the plasma gets too hot (e.g., above 50 eV), then the production of EUV radiation 26 at 13.5 nm is reduced. The optimum pulse duration of second pulse P2 also sets the optimum laser intensity in W/$cm^2$ at the plasma surface.

FIGS. 11A through 11D indicate that the optimum fractional ion density ρ is about 0.05 as corresponding to the peak in the EUV conversion efficiency (FIG. 11A), which translates into an optimal ion density $N_{ion}$ of $0.05 \times 10^{19}$ ion/$cm^3$. This fractional ion density ρ also closely corresponds to the maximum EUV opacity in FIG. 11B. FIG. 11C shows a low IR transmission loss at this fractional ion density, and the source width d as indicated in FIG. 11D is below 1 mm.

Figure 12B:
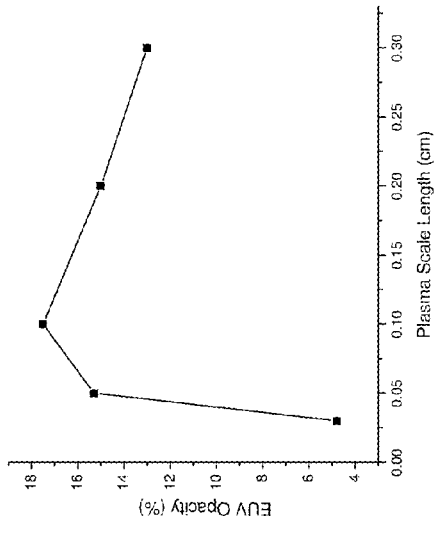
FIGS. 12A through 12D are similar to FIGS. 11A through 11D, except that the horizontal axis is now the plasma scale length from center to edge in centimeters.
Figure 12D:
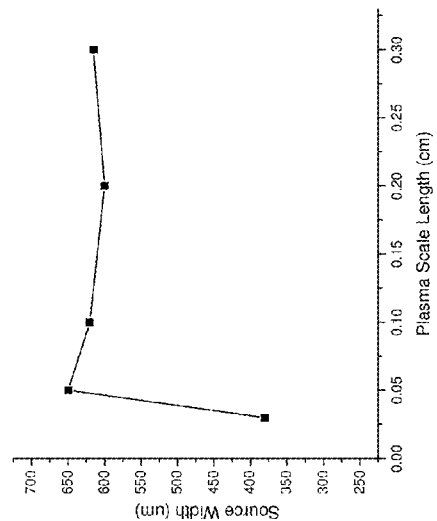
Figure 12A:
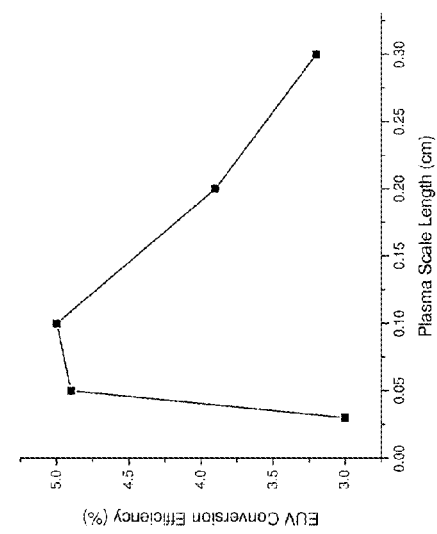
Figure 12C:
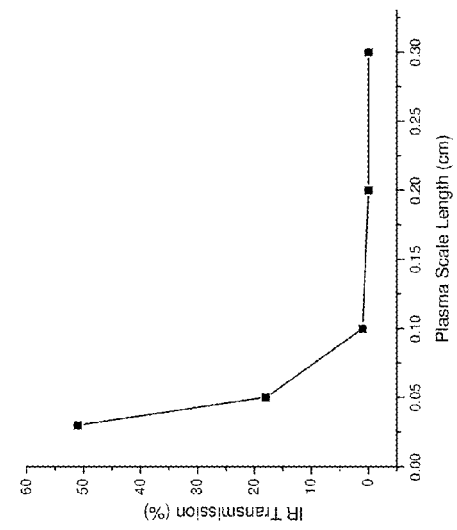

FIGS. 12A through 12D are similar to FIGS. 11A through 11D, except that the horizontal axis is now the plasma scale length (plasma diameter D divided by 2; see FIG. 14) in centimeters. FIGS. 12A through 12D indicate that optimum plasma scale length is about 1 mm (i.e., D is about 2 mm) because this length allows for absorption of just about all the incident IR laser light (FIG. 12C) and a maximum in EUV conversion efficiency (FIG. 12A). Meanwhile, the EUV opacity is at a maximum (FIG. 12B) and the source width d is less than 1 mm (FIG. 12D).

FIGS. 13A through 13D are similar to FIGS. 11A through 11D, except that the horizontal axis is the laser pulse width (duration) in nanoseconds (ns). FIGS. 13A through 13D indicate that the optimum pulse duration for IR laser pulse P2 is about 30 ns. This maximizes the EUV conversion efficiency (FIG. 13A) and the absorption of IR laser pulse P2 (FIG. 13C). The EUV opacity for this pulse is still relatively high (FIG. 13B), and the source width d is below 1 mm (FIG. 13D). If the pulse P2 had a greater duration, the plasma would expand while the laser was still irradiating it. This would lead to IR laser transmission loss, a lower plasma temperature and a lower EUV conversion efficiency.

This type of parametric analysis, though carried out in one dimension, allows one to quickly converge to the optimum parameters or "sweet spot" in the parameter space for producing an optimum three-dimensional EUV radiation source $24f$ for carrying out EUV lithography.

Figure 14:
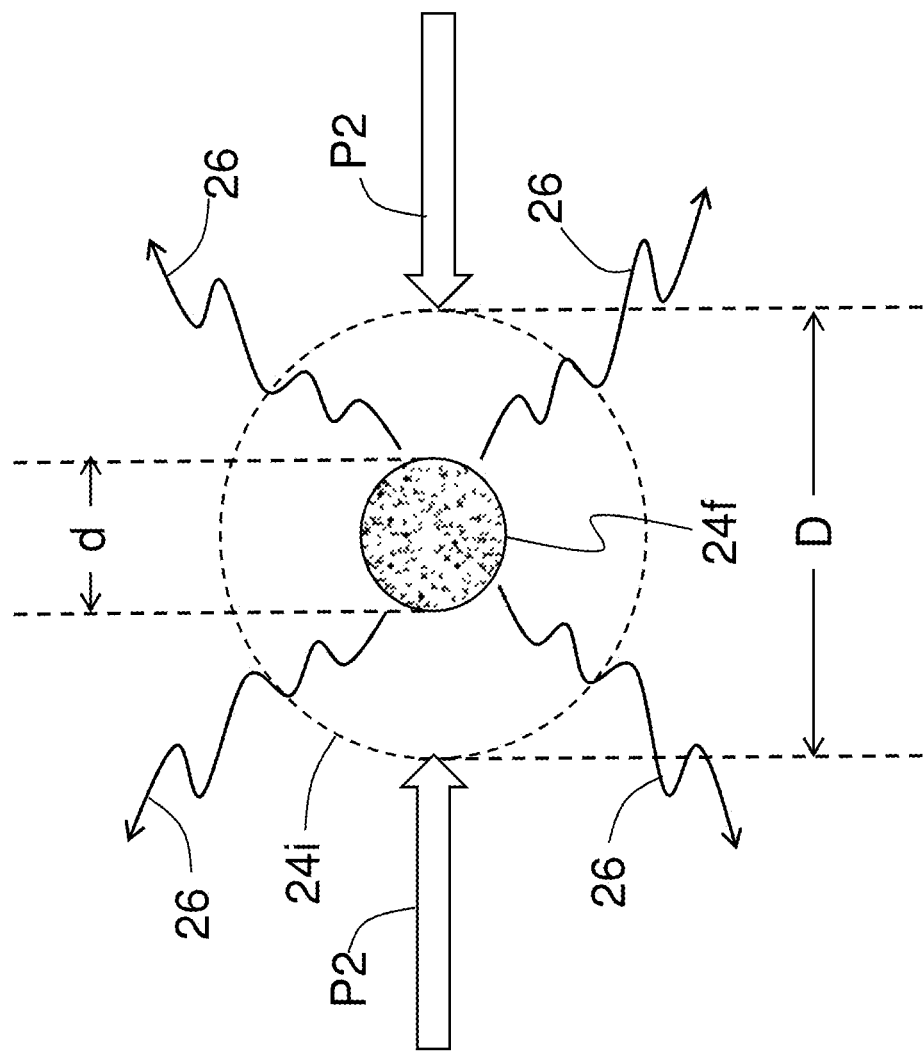
FIG. 14 is a schematic diagram of an example EUV emitting region of hot plasma formed within the larger generally spherical plasma that is symmetrically illuminated by the high intensity laser.

FIG. 14 is a schematic diagram of an example final "EUV emitting region" $24f$ formed within the larger initial plasma $24i$ that is irradiated by P2. EUV production at 13.5 nm is a strongly non-linear function of temperature. Thus, a hot spot at the center of the irradiated initial plasma $24i$ results in the small, intense, localized final EUV emitting region $24f$ that serves as the compact EUV radiation source. FIG. 14 clarifies the point by way of illustration that "final plasma" $24f$ actually includes a hot core region that strongly emits EUV radiation $26$ while the surrounding region of the final plasma does not substantially emit EUV radiation. Thus, the EUV radiation source $24f$ can also be referred to as the "EUV emitting region" $24f$ of the final plasma. The initial plasma $24i$ is shown as a dashed line, as a central portion of this plasma is rapidly transformed into the final plasma $24f$ upon irradiation by pulses P2.

Initial plasma $24i$ with the above-identified optimum initial conditions ($\rho=0.05$, initial plasma diameter D of about 2 mm) is irradiated symmetrically with pulses P2 of $6\times10^{19}$ W/cm$^2$ at the initial plasma surface. Based on the 1D analytical results, the optimum initial plasma $24i$ has a low ion density (of Sn), e.g., about $N_{ion}=0.05\times10^{19}$ ion/cm$^3$. The optimum full width of the initial plasma $24i$ is about D=2 mm. The optimum duration of laser pulse P2 is about 30 ns.

Under these initial conditions, the resulting EUV radiation source emitting region $24f$ has approximately the following characteristics:

1. Conversion efficiency from laser power to narrowband EUV power at 13.5 nm of approximately 5%.
2. The diameter d of EUV radiation source emitting region $24f$ at the center of the initial plasma $24i$ is about d=0.5 mm.
3. The EUV opacity (at 13.5 nm) of the plasma from center to edge is about 10% (i.e. 90% transmission)
4. The laser IR reflection should be relatively small (<<10%) because the plasma electron density is below the critical density $n_c$ for IR reflection. In an example embodiment, the ion density $N_{ion}$ is at least a factor of two and can be about a factor of 20 below the critical ion density $n_c$.

As discussed above in connection with FIGS. 1A and 1B, initial plasma $24i$ can be produced by irradiating a substantially low mass Sn droplet 22 with a first laser pulse P2 and allowing the initial plasma to expand until it achieves the optimum density and scale size. This expanded initial plasma $24i$ is then irradiated with the high intensity $CO_2$ laser pulses as described above in connection with FIGS. 1B and 1C.

Figure 15:
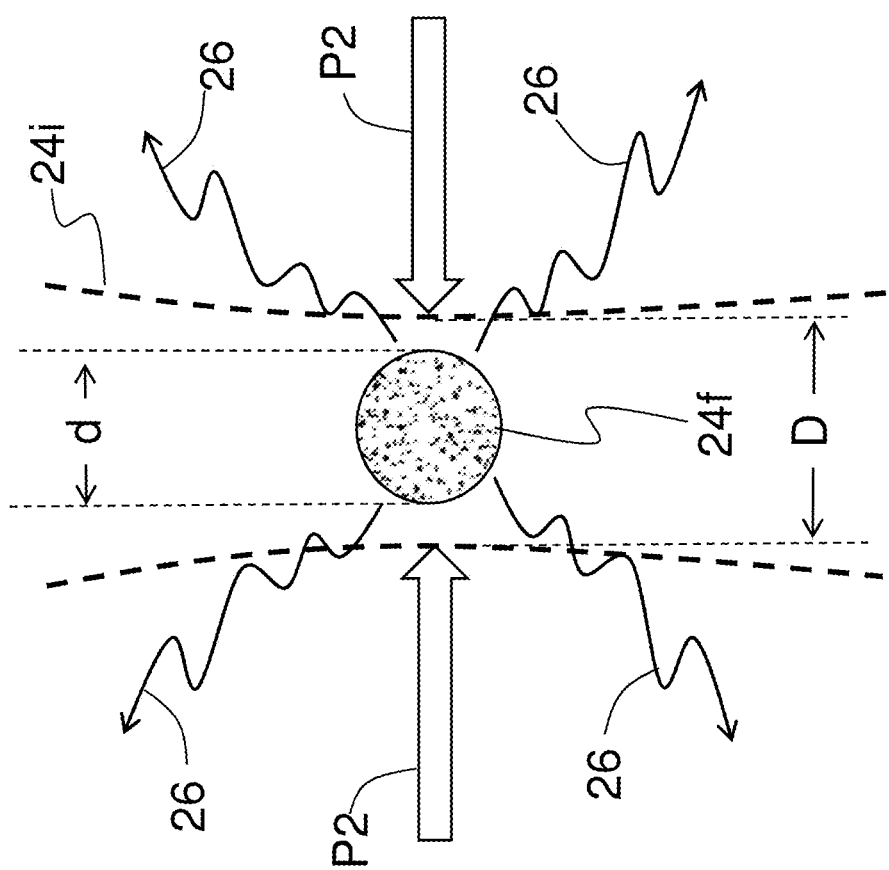
FIG. 15 is a schematic diagram similar to FIG. 14, but wherein the EUV emitting region of hot plasma is formed within an initial plasma that is in the form of an elongated plasma jet.

In an example embodiment, initial plasma $24i$ is created using a plasma jet comprising Sn ions. FIG. 15 is a schematic diagram similar to FIG. 14, but wherein the initial plasma is in the form of an elongated plasma jet. The plasma jet can have the above-described ion and electron densities and scale, and can be irradiated symmetrically with multiple second pulses P2. In the case where initial plasma $24i$ has the form of a plasma jet, its symmetry will be more cylindrical than spherical. This difference in symmetries will change the optimum conditions and outcomes slightly as compared to an initial plasma with spherical symmetry.

It will be apparent to those skilled in the art that various modifications and variations can be made to the present invention without departing from the spirit and scope of the disclosure. Thus it is intended that the present invention cover the modifications and variations of this invention provided they come within the scope of the appended claims and their equivalents.

What is claimed is:

1. A source-collector module (SoCoMo) apparatus for an extreme ultraviolet (EUV) lithography system, comprising:
    a grazing-incidence collector (GIC) having an optical axis, an input end and an output end, with an intermediate focus adjacent the output end;
    a low-mass target residing along the GIC optical axis at a first location;
    at least a first laser operably arranged to generate at least a first light pulse of first infrared (IR) radiation to the first location to irradiate the low-mass target to substantially vaporize and ionize the low-mass target to form an initial plasma, wherein the initial plasma reflects a portion of the first IR radiation to form first reflected IR radiation;
    at least a second laser operably arranged to generate at least a second light pulse of second IR radiation to irradiate the initial plasma to form a final plasma having an EUV-emitting region that substantially isotropically emits EUV radiation, wherein the final plasma reflects and a portion of the second IR radiation to form second reflected IR radiation;
    a first debris mitigation device (DMD) operably arranged between the final plasma and the GIC;
    a multilayer-coated spherical mirror arranged along the GIC optical axis adjacent the low-mass target and opposite the GIC and focused on the EUV-emitting region so that the multi-layer coated spherical mirror receives a portion of the emitted EUV radiation and directs it back to the EUV-emitting region to travel through the DMD and then to the input end of the GIC;
    wherein the at least first and at least second lasers are arranged relative to the low-mass target and the GIC mirror such that at least the second reflected IR radiation is not directed towards either the GIC mirror or the spherical mirror and remains substantially uncollected by the GIC mirror and by the spherical mirror.

2. The SoCoMo apparatus according to claim 1, further comprising a pair of first lasers symmetrically arranged about the GIC optical axis.

3. The SoCoMo apparatus according to claim 2, further comprising a pair of second lasers symmetrically arranged about the GIC optical axis.

4. The SoCoMo apparatus according to claim 1, wherein the low-mass target comprises a tin droplet having a diameter in the range of 10 μm to 40 μm.

5. The SoCoMo apparatus according to claim 1, further comprising a tin droplet source configured to deliver the tin droplet to the first location.

6. The SoCoMo apparatus according to claim 1, wherein the GIC collects a portion of the EUV radiation and directs the collected portion of the EUV radiation to the intermediate focus.

7. The SoCoMo apparatus according to claim 1, wherein the final plasma has an energy in the range from about 20 eV to about 50 eV.

8. The SoCoMo apparatus according to claim 1, wherein the final plasma has an electron density of no greater than $10^{19}$ e/cm$^3$.

9. The SoCoMo apparatus according to claim 1, further comprising:
- a second debris mitigation device operably disposed between the first location and the multilayer-coated spherical mirror; and
- a buffer gas source that introduces a buffer gas between the EUV source and the second debris mitigation device.

10. The SoCoMo apparatus according to claim 1, wherein: the at least first light pulse has a time duration in the range from 10 ns to 50 ns and an energy in the range from about 1 mJ to about 10 mJ.

11. The SoCoMo apparatus according to claim 1, wherein the emitting region has a diameter of about 1 mm or less.

12. The SoCoMo apparatus according to claim 1, further comprising means for reducing an amount of out-of-band radiation from reaching the intermediate focus.

13. The SoCoMo apparatus according to claim 12, wherein the IR radiation has a wavelength of about 10.6 microns and EUV radiation has a wavelength of about 13.5 nanometers.

14. The SoCoMo apparatus according to claim of claim 1, wherein the GIC includes at least one mirror shell having at least one reflective surface, and wherein the at least one reflective surface includes a grating configured to diffract infrared radiation and to substantially specularly reflect EUV radiation.

15. The SoCoMo apparatus according to claim of claim 14, wherein the grating is blazed.

16. The SoCoMo apparatus according to claim of claim 14, wherein the (GIC) has an input end and an output end, and wherein the grating includes elements that run longitudinally from the input end to the output end.

17. The SoCoMo apparatus according to claim of claim 14, wherein the grating comprises stepwise azimuthal grating elements defined by a plurality of ellipsoids of revolution having common foci.

18. The SoCoMo apparatus according to claim of claim 14, wherein the grating is configured to cause destructive interference of a zeroeth diffraction order of the IR radiation.

19. The SoCoMo apparatus according to claim of claim 18, further comprising an aperture at the intermediate focus, and wherein substantially all of the diffracted IR radiation is blocked by the aperture and wherein substantially all of the specularly reflected EUV radiation passes through the aperture.

* * * * *